US009714756B2

(12) United States Patent
Morgan et al.

(10) Patent No.: US 9,714,756 B2
(45) Date of Patent: Jul. 25, 2017

(54) ILLUMINATION DEVICE

(71) Applicant: MORGAN SOLAR INC., Toronto (CA)

(72) Inventors: John Paul Morgan, Toronto (CA); Michael Sinclair, Toronto (CA); Nigel Morris, Toronto (CA); Pascal Dufour, Toronto (CA); Stefan Myrskog, Maple (CA); Brett Barnes, Toronto (CA); Philip Chang, Toronto (CA); Stephen Caelers, Oakville (CA)

(73) Assignee: MORGAN SOLAR INC., Toronto (CA)

( * ) Notice: Subject to any disclaimer, the term of this patent is extended or adjusted under 35 U.S.C. 154(b) by 273 days.

(21) Appl. No.: 14/218,649

(22) Filed: Mar. 18, 2014

(65) Prior Publication Data
US 2014/0268758 A1 Sep. 18, 2014

Related U.S. Application Data

(63) Continuation-in-part of application No. 14/196,523, filed on Mar. 4, 2014, and a continuation-in-part of (Continued)

(30) Foreign Application Priority Data

Mar. 4, 2014 (WO) ................ PCT/CA2014/000167
Mar. 4, 2014 (WO) ................ PCT/CA2014/050168

(51) Int. Cl.
F21V 7/00 (2006.01)
F21V 8/00 (2006.01)
(Continued)

(52) U.S. Cl.
CPC ............ *F21V 7/0091* (2013.01); *F21V 5/007* (2013.01); *F21V 7/0008* (2013.01); (Continued)

(58) Field of Classification Search
CPC .......................... H01K 1/0209; H01L 31/0543
See application file for complete search history.

(56) References Cited

U.S. PATENT DOCUMENTS 4,045,245 A  8/1977 Coleman et al.
4,148,299 A  4/1979 Sherman
(Continued)

FOREIGN PATENT DOCUMENTS

CN  202134560 U  2/2012
EP  1715260 A2  10/2006
(Continued)

OTHER PUBLICATIONS

International Search Report from PCT/US2014/031002; Sep. 24, 2014; Charlotte Albayrak.
(Continued)

*Primary Examiner* — Andrew Coughlin
*Assistant Examiner* — Colin Cattanach
(74) *Attorney, Agent, or Firm* — BCF LLP

(57) ABSTRACT

Device for providing comprising: A panel having rigid layer having a patterned electrical circuit thereon. An array of illuminating units, each unit being formed by at least one rigid element and a portion of the rigid layer; and including: a rigid optical dispersing element, a light source sandwiched within the panel for generating light from electrical energy, and an electrical conductor. The electrical conductor being the primary heat sink for the light source, the light source being primarily cooled via conduction. The electrical conductor and the optical dispersing element being dimensioned and arranged within the unit such that the electrical conductor does not materially impede transmission of light generated by the light source to the outside of the device. The electrical conductor transmitting electrical and thermal energy received from the light source away from the unit.

20 Claims, 29 Drawing Sheets

Related U.S. Application Data application No. 14/196,291, filed on Mar. 4, 2014, now Pat. No. 9,464,782, and a continuation-in-part of application No. 14/196,618, filed on Mar. 4, 2014, now Pat. No. 9,464,783, and a continuation-in-part of application No. 14/215,913, filed on Mar. 17, 2014.

(60) Provisional application No. 61/798,205, filed on Mar. 15, 2013, provisional application No. 61/948,020, filed on Mar. 4, 2014.

(51) Int. Cl.
| | |
|---|---|
| F21V 5/00 | (2015.01) |
| F21V 13/04 | (2006.01) |
| F21V 29/70 | (2015.01) |
| H05K 1/02 | (2006.01) |
| F21Y 105/10 | (2016.01) |
| F21Y 115/10 | (2016.01) |

(52) U.S. Cl.
CPC .......... *F21V 7/0041* (2013.01); *F21V 7/0083* (2013.01); *F21V 13/04* (2013.01); *F21V 29/70* (2015.01); *G02B 6/0048* (2013.01); *G02B 6/0053* (2013.01); *H05K 1/0209* (2013.01); *F21Y 2105/10* (2016.08); *F21Y 2115/10* (2016.08); *H05K 2201/09809* (2013.01); *H05K 2201/10106* (2013.01)

(56) References Cited

U.S. PATENT DOCUMENTS

| | | | |
|---|---|---|---|
| 4,337,758 A | 7/1982 | Meinel et al. | |
| 4,877,460 A | 10/1989 | Floedl | |
| 4,962,450 A | 10/1990 | Reshetin | |
| 4,975,814 A * | 12/1990 | Schairer | B60Q 1/2696 257/E25.02 |
| 5,197,792 A | 3/1993 | Jiao et al. | |
| 5,528,057 A | 6/1996 | Yanagase et al. | |
| 5,791,757 A | 8/1998 | O'Neil et al. | |
| 5,897,184 A | 4/1999 | Eichenlaub et al. | |
| 5,914,760 A | 6/1999 | Daiku | |
| 6,097,549 A | 8/2000 | Jenkins et al. | |
| 6,307,145 B1 | 10/2001 | Kataoka et al. | |
| 6,578,989 B2 | 6/2003 | Osumi et al. | |
| 6,811,277 B2 | 11/2004 | Amano | |
| 6,906,459 B2 * | 6/2005 | Suehiro | H01L 33/60 257/100 |
| 6,951,415 B2 | 10/2005 | Amano et al. | |
| 6,987,613 B2 * | 1/2006 | Pocius | G02B 5/32 257/98 |
| 7,021,805 B2 * | 4/2006 | Amano | F21S 48/215 362/307 |
| 7,072,096 B2 | 7/2006 | Holman et al. | |
| 7,083,313 B2 | 8/2006 | Smith | |
| 7,152,985 B2 | 12/2006 | Benitez et al. | |
| 7,160,010 B1 | 1/2007 | Chinniah et al. | |
| 7,290,906 B2 | 11/2007 | Suzuki et al. | |
| 7,316,496 B2 | 1/2008 | Wu et al. | |
| 7,391,939 B1 | 6/2008 | Williams | |
| 7,431,481 B2 | 10/2008 | Stefanov | |
| 7,467,879 B2 | 12/2008 | Herloski et al. | |
| 7,626,761 B2 | 12/2009 | Haga et al. | |
| 7,664,350 B2 | 2/2010 | Ghosh et al. | |
| 7,672,549 B2 | 3/2010 | Ghosh et al. | |
| 7,697,219 B2 | 4/2010 | Didomenico | |
| 7,740,392 B2 | 6/2010 | Itoh et al. | |
| 7,794,100 B2 | 9/2010 | Ito | |
| 7,855,335 B2 | 12/2010 | Maeda | |
| 7,873,257 B2 | 1/2011 | Morgan | |
| 7,925,129 B2 | 4/2011 | Ghosh et al. | |
| 8,030,569 B2 | 10/2011 | Nakata | |
| 8,067,688 B2 | 11/2011 | Gronet | |
| 8,279,164 B2 | 10/2012 | Daiku | |
| 8,328,403 B1 * | 12/2012 | Morgan | G02B 6/26 362/606 |
| 8,412,010 B2 | 4/2013 | Ghosh et al. | |
| 8,586,860 B2 | 11/2013 | Nakata | |
| 8,609,455 B2 | 12/2013 | Krasnov et al. | |
| 8,885,995 B2 | 11/2014 | Morgan | |
| 2002/0024808 A1 | 2/2002 | Suehiro et al. | |
| 2002/0085390 A1 * | 7/2002 | Kiyomoto | B60Q 1/302 362/555 |
| 2005/0030960 A1 * | 2/2005 | Sumida | G02B 6/0031 370/402 |
| 2005/0212397 A1 * | 9/2005 | Murazaki | C09K 11/0883 313/487 |
| 2005/0265029 A1 * | 12/2005 | Epstein | G02B 3/0056 362/339 |
| 2006/0060867 A1 * | 3/2006 | Suehiro | H01L 33/56 257/81 |
| 2007/0002566 A1 * | 1/2007 | Wu | G02F 1/133603 362/245 |
| 2007/0181901 A1 | 8/2007 | Loh | |
| 2007/0189017 A1 | 8/2007 | Hofmann | |
| 2007/0217202 A1 | 9/2007 | Sato | |
| 2007/0236927 A1 | 10/2007 | Liu | |
| 2007/0251568 A1 | 11/2007 | Maeda | |
| 2007/0256724 A1 | 11/2007 | Fork et al. | |
| 2007/0256725 A1 | 11/2007 | Fork et al. | |
| 2007/0256726 A1 | 11/2007 | Fork et al. | |
| 2007/0279910 A1 | 12/2007 | Lin | |
| 2008/0087321 A1 | 4/2008 | Schwartzman | |
| 2008/0087323 A1 | 4/2008 | Araki | |
| 2008/0316761 A1 | 12/2008 | Minano et al. | |
| 2009/0002297 A1 | 1/2009 | Koester | |
| 2009/0071467 A1 | 3/2009 | Benitez et al. | |
| 2009/0165842 A1 | 7/2009 | McDonald et al. | |
| 2009/0188546 A1 | 7/2009 | McGlynn et al. | |
| 2009/0213607 A1 | 8/2009 | Tatsukawa | |
| 2009/0223555 A1 | 9/2009 | Ammar | |
| 2009/0256999 A1 | 10/2009 | Ogasawara et al. | |
| 2009/0277498 A1 | 11/2009 | Angel | |
| 2010/0012169 A1 | 1/2010 | Jensen et al. | |
| 2010/0024868 A1 | 2/2010 | Baruchi et al. | |
| 2010/0043864 A1 | 2/2010 | Young et al. | |
| 2010/0051102 A1 | 3/2010 | Lin | |
| 2010/0059108 A1 | 3/2010 | McDonald et al. | |
| 2010/0103349 A1 | 4/2010 | Schmidt et al. | |
| 2010/0116319 A1 | 5/2010 | Martinez et al. | |
| 2010/0116336 A1 * | 5/2010 | Martinez Anton | F24J 2/06 136/259 |
| 2010/0126554 A1 | 5/2010 | Morgan et al. | |
| 2010/0165495 A1 | 7/2010 | Murtha | |
| 2010/0186798 A1 | 7/2010 | Tormen et al. | |
| 2010/0224232 A1 | 9/2010 | Cummings et al. | |
| 2010/0278480 A1 * | 11/2010 | Vasylyev | G02B 3/005 385/33 |
| 2010/0307565 A1 * | 12/2010 | Suga | H01L 31/0543 136/246 |
| 2011/0011449 A1 | 1/2011 | Morgan et al. | |
| 2011/0044000 A1 | 2/2011 | Minano et al. | |
| 2011/0096426 A1 | 4/2011 | Ghosh et al. | |
| 2011/0120539 A1 * | 5/2011 | Minano | G01J 1/02 136/255 |
| 2011/0132426 A1 | 6/2011 | Kang et al. | |
| 2011/0132432 A1 | 6/2011 | Schultz et al. | |
| 2011/0155210 A1 | 6/2011 | Kim et al. | |
| 2011/0155221 A1 | 6/2011 | Yu et al. | |
| 2011/0214738 A1 | 9/2011 | Halahmi et al. | |
| 2011/0292655 A1 | 12/2011 | Ing et al. | |
| 2012/0055552 A1 | 3/2012 | Morgan et al. | |
| 2012/0099325 A1 | 4/2012 | Ghosh et al. | |
| 2012/0112557 A1 | 5/2012 | Sager | |
| 2012/0145221 A1 | 6/2012 | Ozaki et al. | |
| 2012/0152331 A1 | 6/2012 | Luo | |
| 2012/0160300 A1 | 6/2012 | Munro | |
| 2012/0167949 A1 | 7/2012 | Dentinger et al. | |
| 2012/0211054 A1 * | 8/2012 | Suga | H01L 31/048 136/246 |
| 2012/0247537 A1 | 10/2012 | Mei | |
| 2012/0255594 A1 | 10/2012 | Bishnoi et al. | |

(56) References Cited

U.S. PATENT DOCUMENTS

| | | |
|---|---|---|
| 2012/0287671 A1 | 11/2012 | Parker et al. |
| 2012/0298181 A1 | 11/2012 | Cashion et al. |
| 2012/0298182 A1 | 11/2012 | Hwang |
| 2012/0312356 A1 | 12/2012 | Mizuo et al. |
| 2012/0318319 A1 | 12/2012 | Pinarbasi et al. |
| 2013/0104984 A1 | 5/2013 | Myrskog |
| 2013/0118559 A1 | 5/2013 | Castillo et al. |
| 2013/0233384 A1 | 9/2013 | Morgan et al. |
| 2013/0247960 A1 | 9/2013 | Morgan |
| 2013/0249293 A1 | 9/2013 | Yang et al. |
| 2013/0276866 A1 | 10/2013 | Maeda |
| 2013/0284237 A1 | 10/2013 | Lin et al. |
| 2013/0298901 A1 | 11/2013 | Ruiz et al. |

FOREIGN PATENT DOCUMENTS

| | | |
|---|---|---|
| EP | 1895228 A1 | 3/2008 |
| EP | 2061092 A1 | 5/2009 |
| EP | 2068378 A2 | 6/2009 |
| EP | 2105682 A2 | 9/2009 |
| EP | 2492966 A1 | 8/2012 |
| GB | 2468410 A | 9/2010 |
| JP | 03253833 | 12/1991 |
| JP | 06160638 | 7/1994 |
| JP | 10012024 | 1/1998 |
| JP | 11271749 | 10/1999 |
| JP | 2006114239 | 4/2006 |
| JP | 2006318807 | 11/2006 |
| JP | 2007012416 A | 1/2007 |
| JP | 2007033803 | 2/2007 |
| JP | 2010101912 | 5/2010 |
| JP | 2013080832 A | 5/2013 |
| WO | 03056876 A2 | 7/2003 |
| WO | 2009/002281 A2 | 12/2008 |
| WO | 2010033632 A2 | 3/2010 |
| WO | 2010033859 A2 | 3/2010 |
| WO | 2010124028 A2 | 10/2010 |
| WO | 2011011885 A1 | 2/2011 |
| WO | 2011022631 A2 | 2/2011 |
| WO | 2011120148 A1 | 10/2011 |
| WO | 2012014088 A2 | 2/2012 |
| WO | 2012085461 A1 | 6/2012 |
| WO | 2013/010313 A1 | 1/2013 |
| WO | 2014005102 A1 | 1/2014 |

OTHER PUBLICATIONS

International Search Report from PCT/US2014/031076; Jul. 16, 2014; Charlotte Albayrak.
English abstract of JP2007012416; retrieved from Espacenet on May 7, 2015.
English Abstract of EP 1 895 228; retrieved from Espacenet on Dec. 18, 2014.
Patent abstracts of Japan of JP 02-277033.
Patent abstracts of Japan of JP 03-253833.
Patent abstracts of Japan of JP 06-160638.
English Abstract of JP 1012024; retrieved from Espacenet on Dec. 18, 2014.
English Abstract of JPH11271749; retrieved from Espacenet on Dec. 18, 2014.
English Abstract of JP2006114239; retrieved from Espacenet on Dec. 18, 2014.
English Abstract of JP2006318807; retrieved from Espacenet on Dec. 18, 2014.
English Abstract of JP2007033803; retrieved from Espacenet on Dec. 18, 2014.
English Abstract of JP2010101912; retrieved from Espacenet on Dec. 18, 2014.
English Abstract of CN202134560; retrieved from Espacenet on Dec. 18, 2014.
U.S. Appl. No. 61/274,735, filed Aug. 20, 2009.
Hallas et al; Lateral translation micro-tracking of planar micro-optic solar concentrator; High and Low Concentrator Systems for Solar Electric Applications V, edited by Lori E. Greene, Raed A. Sherif; vol. 7769 776904-1.
Sakurada et al; Simulation of Temperature Characteristics of InGaP/InGaAs/Ge—Triple-Junction Solar Cell under Concentrated Light; Japanese Journal of Applied Physics 50 (2011) 04DP13; 4 pages.
Winston; Thermodynamically efficient Nonimaging Optics; Dan David Symposium; University of California MERCED; Sep. 26, 2008; 42 pages.
Solfocus; Concentrated Photovoltaics, Solfocus; Feb. 13, 2013; 3 pages.
Winston et al.; Planar concentrators near the étendue limit; Optics Letters; vol. 30, No. 19; Oct. 1, 2005; pp. 2617-2619.
Victoria et al; Optical Characterization of FluidReflex Concentrator; Politecnica Instituto de Energia Solar; 6 International Conference on Concentrating Photovoltaic Systems; Apr. 9, 2010.
Steiner et al.; Increasing the Energy Yield of CPV Modules through Optimized Solar Cell Interconnection; 7th International Conference on Concentrating Photovoltaic Systems; AIP Conference Proceedings 1407, 404 (2011); Published by the AIP Publishing; pp. 404-408.
Karp et al.; Planar micro-optic solar concentration using multiple imaging lenses into a common slab waveguide; Photonics Systems Integration Lab; University of California San Diego Jacobs School of Engineering; Aug. 4, 2009; 22 pages.
Unger, Blair L.; Dimpled Planar Lightguide Solar Concentrators; ProQuest Dissertations and Theses; 2010; ProQuest Dissertations & Theses (PQDT); The Institute of Optics Arts, Sciences and Engineering, Edmund A. Hajim School of Engineering and Applied Science; University of Rochester; Rochester, New York.

* cited by examiner

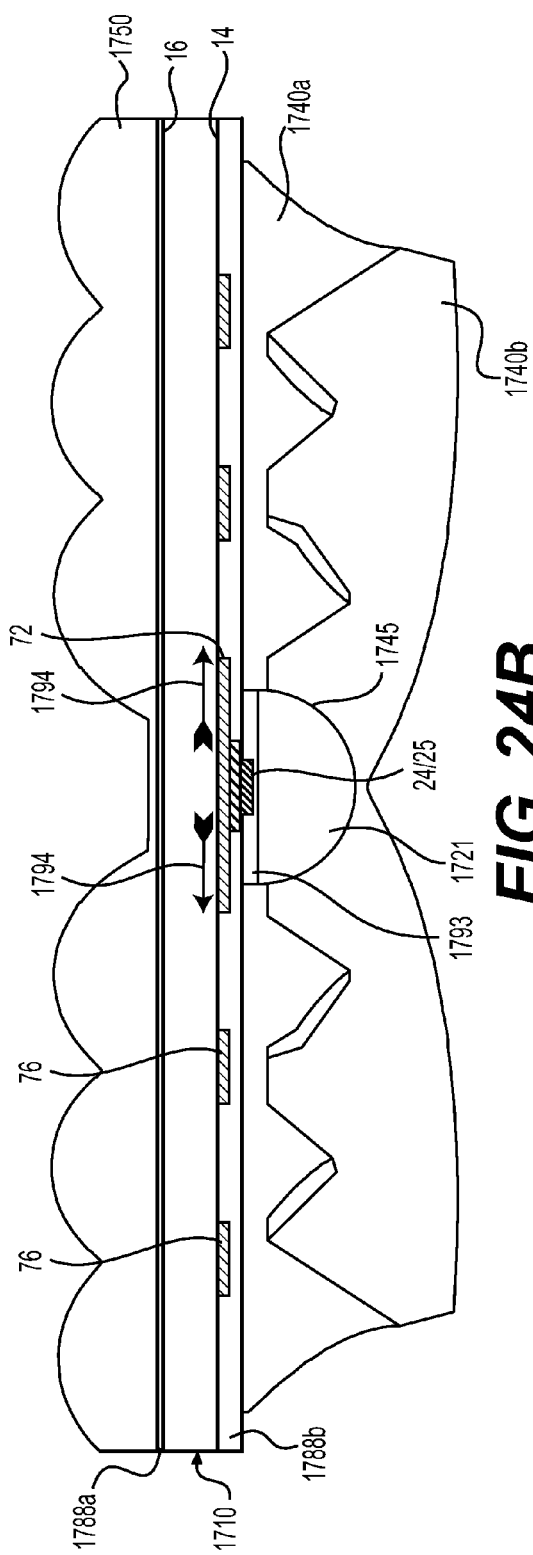
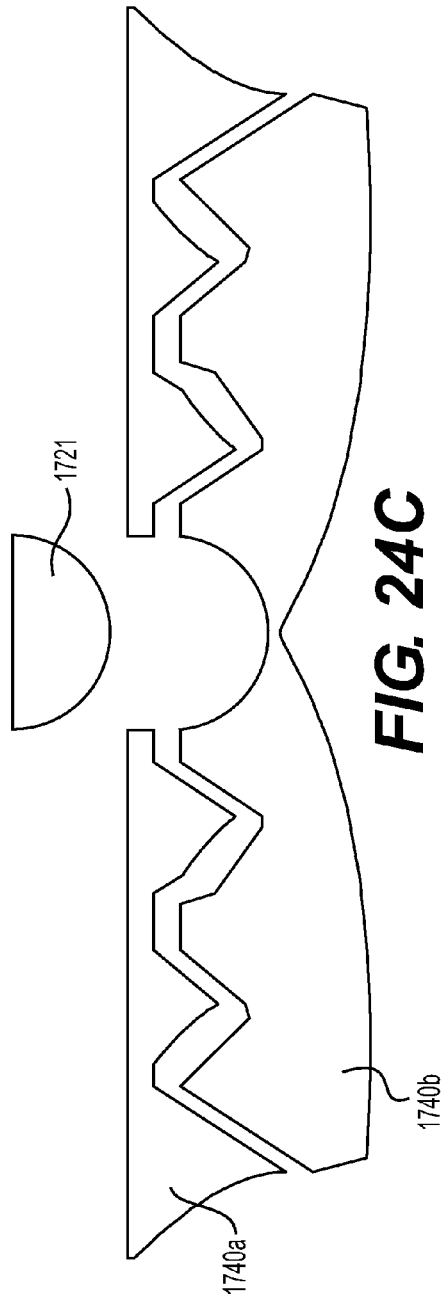
FIG. 24B
FIG. 24C

ILLUMINATION DEVICE

CROSS-REFERENCE

The present application claims priority to U.S. Provisional Patent Application No. 61/798,205, filed Mar. 15, 2013, entitled "Concentrated Photovoltaic Panel" the entirety of which is incorporated herein by reference for all purposes. The present application also claims priority to or the benefit of the following applications filed on Mar. 4, 2014: U.S. patent application Ser. Nos. 14/196,523; 14/196,291 and 14/196,618; U.S. Provisional Patent Application No. 61/948,020; and International Patent Application Nos. PCT/CA2014/050168 and PCT/CA2014/000167. The present application also claims the benefit of the following application filed on Mar. 17, 2014: U.S. patent application Ser. No. 14/215,913.

FIELD

The present technology relates to devices for providing illumination.

BACKGROUND

One way to provide illumination is to use compact light dispersing illumination systems such as systems that employ optical components to disperse light from a light source such as an LED across a relatively wide area. Light dispersing illumination systems and components for dispersing light have been developed over the years. Some of these designs comprise a two-stage compact light disperser in which a light dispersing layer is optically coupled to a light redirecting layer. The redirecting layer includes a light-guide that guides the light laterally within the light-guide away from the light source towards the light dispersing layer by total internal reflections with almost no loss of energy. Several examples are shown in United States Patent Application Publication No. 2010/0202142, entitled "Illumination Device" which is assigned to the applicant of the present application.

One of the difficulties with some conventional compact light dispersing systems is that a relatively significant amount of heat (thermal energy) is generated at the light source, which can reduce the efficiency of electricity-to-light conversion by the source, and thus should be removed from the source during operation of the device. In order to transfer this heat away from the light source, conventional compact light dispersing illumination systems typically have the light source mounted on an outer surface of the device, attached to a large heat sink. While such designs are adequate for their intended purpose, improvements in this area may nonetheless be desirable.

SUMMARY

It is an object of the present technology to ameliorate at least one of the inconveniences present in conventional compact illumination systems, be it one of the inconveniences described above or otherwise.

In one aspect, embodiments of the present technology provide a device for providing illumination comprising:
a panel having at least one rigid layer, the at least one rigid layer having at least one patterned electrical circuit thereon;
an array of illuminating units, each unit being formed by at least one rigid element and a portion of the at least one rigid layer, each unit including:
a rigid optical dispersing element secured to the at least one rigid layer for dispersing light outside the unit,
a light source secured to the at least one rigid layer and sandwiched within the panel for converting electrical energy into light, and
an electrical conductor in electrical communication with the light source to transmit electrical energy thereto, the electrical conductor being in thermal communication with the light source to receive thermal energy therefrom, the electrical conductor being the primary heat sink for the light source, the light source being primarily cooled via conduction;
the electrical conductor and the optical dispersing element of each unit being dimensioned and arranged within the unit such that the electrical conductor does not materially impede transmission of light generated by the light source within the unit to outside the unit;
the electrical conductor being at least electrically and thermally interconnected with the patterned circuit to transmit electrical energy to the light source and to receive thermal energy from the light source for transmission away from the unit.

In the context of the present specification, the term "rigid" should be understood to mean that a "rigid" structure is one that generally maintains its form under normal operating conditions on its own, without requiring external forces (such as those generated by a pressured gas) to do so. "Rigid", however, in the present context does not mean that the structure in question is completely inflexible; as structures which are slightly flexible or expandable and return to their original size and shape after flexion (and/or expansion) are included within the definition of "rigid" in the present context.

In the context of the present specification a "patterned" electrical circuit should be understood to be an electric circuit not of a random layout. In some embodiments, the patterned electrical circuit includes portions that are of a repeating design.

In the context of the present specification two elements may be "secured" together in any number of various ways. For example, such elements may bonded to one another (be it permanently or releasably), by being formed together in a single physical element, by being held in place one with respect to another by other elements, etc.

In the context of the present specification, an electrical conductor is considered to be the primary heat sink for the light source when under normal operating conditions of the device, a greater amount of thermal energy transferred away from the light source via direct conduction is transferred away via the electrical conductor than via any other element of the device.

In the context of the present specification, a light source is considered to be primarily cooled via conduction when under normal operating conditions of the device, more thermal energy is transferred away from the light source via direct conduction than via direct convection or direct radiation.

In the context of the present specification, two elements are electrically interconnected when electricity can pass between them, be it directly or indirectly. Thus, two elements may, for example, be electrically interconnected via their direct physical connection to each other or via their direct physical connection to a third element, etc.

In the context of the present specification, two elements are thermally interconnected when thermal energy can transfer between them via conduction, either directly, or indirectly through a third element.

In some embodiments the light source is sandwiched between the at least one rigid layer and the rigid optical dispersing element.

In some embodiments the optical dispersing element of each unit is a series of optical dispersing elements. In some such embodiments the optical dispersing element of each unit is a series of concentric annular optical dispersing elements.

In some embodiments the rigid optical dispersing elements of multiple units are all part of a single rigid layer distinct from the at least one rigid layer having the at least one patterned electrical circuit thereon.

In some embodiments the electrical conductor and the optical dispersing element of each unit are dimensioned and arranged within the unit such that the electrical conductor impedes transmission of no more than 20% of the light generated by the light source within the unit to outside the unit.

In some embodiments each unit of the array further includes a rigid optical redirecting element secured to the at least one rigid layer for redirecting light within the unit to the optical dispersing element; and the electrical conductor, the optical dispersing element, and the optical redirecting element of each unit are dimensioned and arranged within the unit such that the electrical conductor does not materially impede transmission of light generated by the light source within the unit to outside the unit.

In some embodiments the light source is sandwiched between the at least one rigid layer and the rigid optical dispersing element.

In some embodiments the light source is sandwiched between the at least one rigid layer and the rigid optical redirecting element.

In some embodiments the optical redirecting element of each unit is a series of optical redirecting elements.

In some embodiments the optical dispersing element of each unit is a series of optical dispersing elements; and the optical redirecting element of each unit is a series of optical redirecting elements.

In some embodiments the optical dispersing element of each unit is a series of concentric annular optical dispersing elements; and the optical redirecting element of each unit is a series of concentric annular optical redirecting elements.

In some embodiments the rigid optical dispersing elements of multiple units are all part of a first single rigid layer distinct from the at least one rigid layer having the at least one patterned electrical circuit thereon; and the rigid optical redirecting elements of multiple units are all part of a second single rigid layer distinct from the at least one rigid layer having the at least one patterned electrical circuit thereon and the first single rigid layer.

In some embodiments the rigid optical redirecting element redirects light from a light guide for transmission to the rigid optical dispersing element.

In some embodiments the light guide has a secondary optical element for redirecting light within the light guide.

In some embodiments the electrical conductor, the optical dispersing element, and the optical redirecting element of each unit are dimensioned and arranged within the unit such that the electrical conductor impedes transmission of not more than 20% of light generated by the light source within the unit to outside the unit.

In some embodiments the light source is at least partially encased in a thermal insulator.

In another aspect, embodiments of the present technology provide a device for providing illumination comprising:
  a panel having a plurality of rigid layers bonded together;
  an array of illuminating units formed by the plurality of layers of the panel, each one of the array of illuminating units including:
    a series of optical dispersing elements associated with a first surface of one of the layers of the plurality of layers for dispersing light outside the unit;
    a series of optical redirecting elements associated with a second surface of one of the layers of the plurality of layers for redirecting light within the unit to the optical dispersing elements;
    a light source sandwiched between two of the layers of the plurality of layers for converting electrical energy into light;
  one of the layers of the plurality of layers having an electrical conductor in electrical communication with the light source to transmit electrical energy thereto, the electrical conductor being in thermal communication with the light source to receive thermal energy therefrom, the electrical conductor being the primary heat sink for the light source, the light source being primarily cooled via conduction;
  the electrical conductor, the series of optical dispersing elements and the series of optical redirecting elements being dimensioned and arranged within the unit such that the electrical conductor does not materially impede transmission of light generated by the light source within the unit to outside the unit;
  one of the layers of the plurality of layers having a patterned circuit electrically and thermally interconnected with light source of at least some of the units to transmit electrical energy thereto and to receive thermal energy therefrom for transmission away from the units.

In some embodiments the series of optical dispersing elements are formed on the first surface; and the series of optical redirecting elements are formed on the second surface.

In some embodiments, the electrical conductor, the optical dispersing element, and the optical redirecting element of each unit are dimensioned and arranged within the unit such that the electrical conductor impedes transmission of not more than 20% of the light generated by the light source within the unit to outside the unit.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIGS. 24A and 24B show cross-sectional views of an embodiment of an optical unit transmitting light through the gaps in a heat spreader portion, and where the redirecting optic has a redirecting portion and a guiding portion;

FIG. 24C is an exploded view of the redirecting optic and envelope of FIGS. 24A and 24B

DETAILED DESCRIPTION OF SOME EMBODIMENTS

Figure 2:
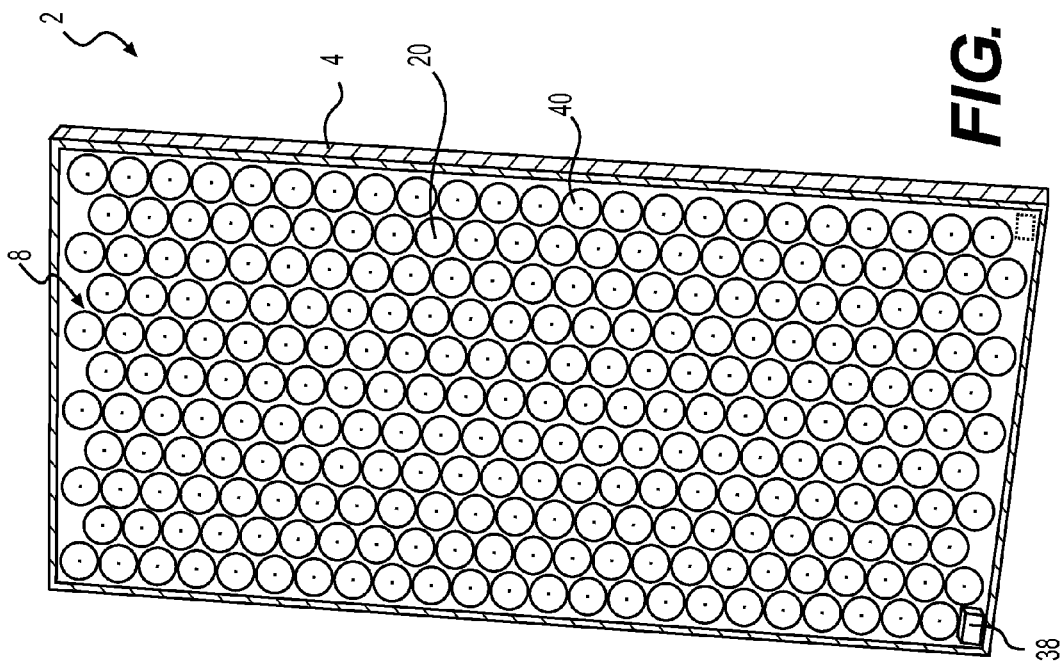
FIG. 2 is a rear perspective view of an embodiment of a light dispersing illumination panel including the present technology.
Figure 1:
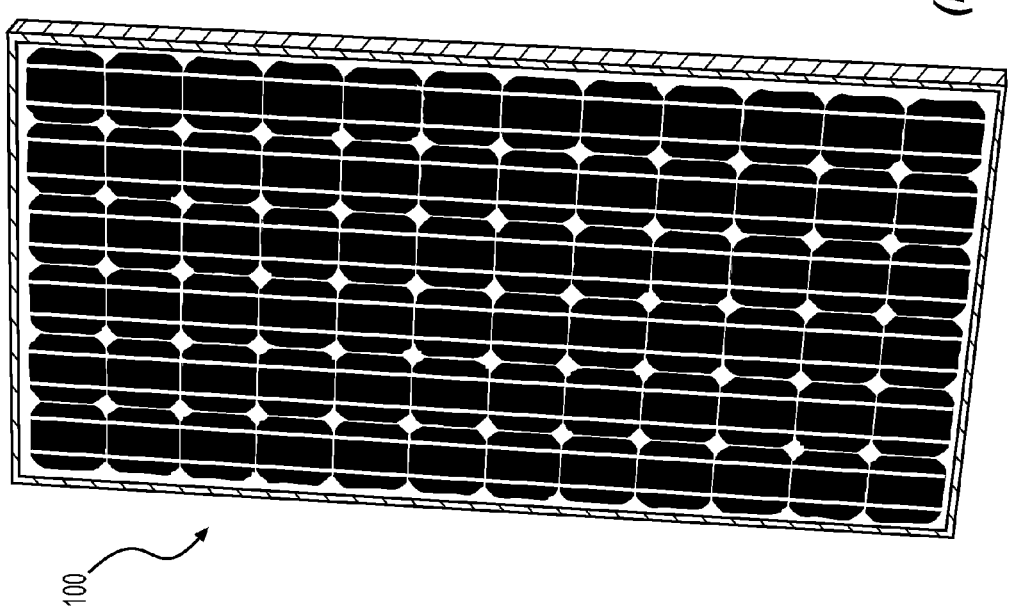
FIG. 1 is a perspective view of a conventional (prior art) photovoltaic panel.

FIG. 2 is a rear perspective view of an embodiment of a compact light dispersing illumination panel 2 (a device for providing illumination) of the present technology. In this embodiment, the illumination panel 2 has a substrate assembly 10, light redirecting optics 40 attached to the substrate assembly 10, dispersing optics 50 (shown in FIG. 3) attached to the substrate assembly 10 (collectively referred to herein as "panel apparatus" 6), a panel frame 4 and a junction box 38. (In other embodiments, the structure of a panel may differ.) For example, in other embodiments the dispersing optics 50 may not be present.) In this embodiment, the panel 2 is made to have dimensions similar to those of a conventional compact concentrated photovoltaic panel 100, such as that shown in FIG. 1. This is not required to be the case however, and in other embodiments, panels may be of different dimensions.

In this embodiment, the substrate assembly 10 includes a rigid sheet 12 of light transmissive material with a conductor pattern 30 (including a patterned electrical circuit) and light source assemblies 20 affixed thereto. The rigid sheet 12 has a first surface 14 and a second surface 16 opposite the first surface 14. Each light source assembly 20 is attached to the first surface 14 of the rigid sheet 12 and electrically connected to the conductor pattern 30. For example, each light source assembly 20 can be bonded to the rigid sheet 12 at bond sites 26 with a conductive epoxy, which can allow attachment to the rigid sheet 12 and electrical connection to the conductor pattern 30 in a single step during assembly. Alternatively, positive and negative contacts of each light source assembly 20 may be soldered to the conductor pattern 30. In yet other embodiments, one of the positive or negative contacts of each light source assembly 20 may be soldered to or bonded with a conductive epoxy to the conductor pattern 30 while the other contact is electrically connected to the conductor pattern 30 by wire bonding, spring clipping or any other means known in the art.

Figure 4:
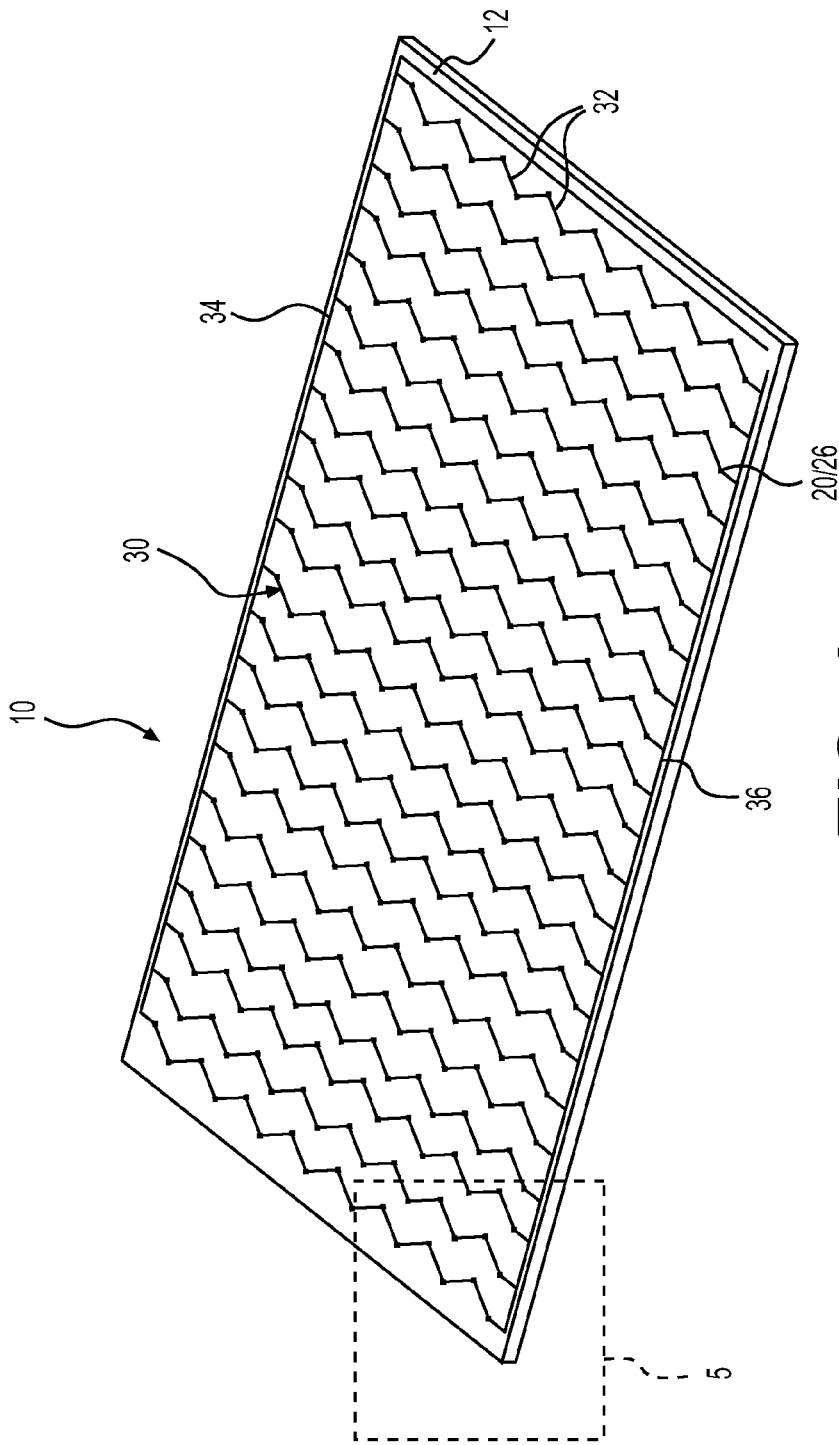
FIG. 4 is a plan view of an embodiment of a substrate assembly.
Figure 5:
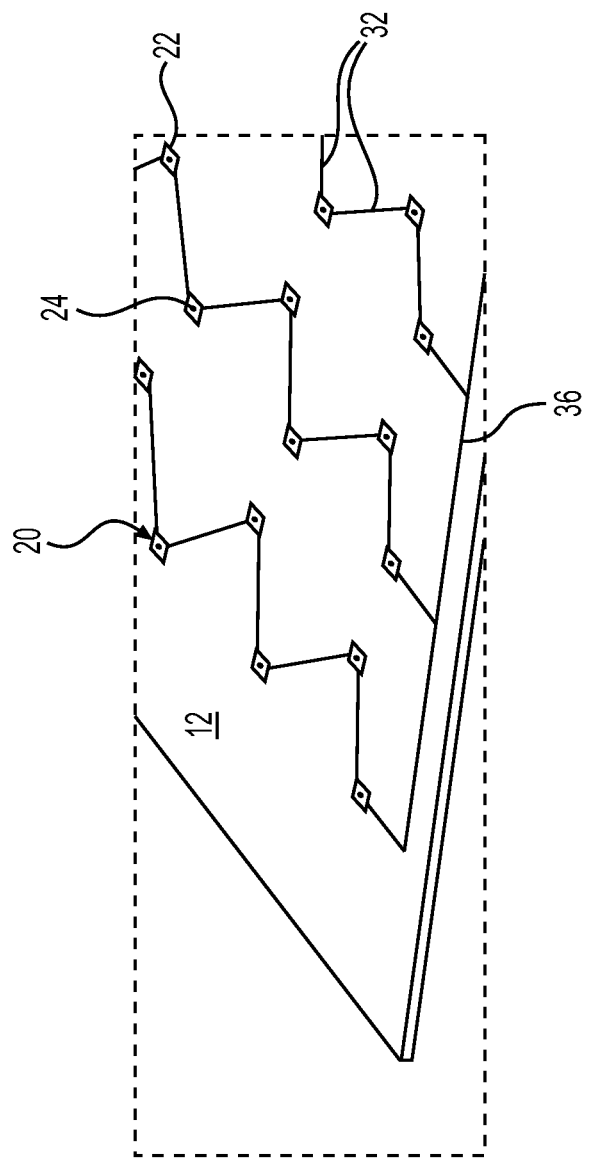
FIG. 5 is a detail view of a portion of the substrate assembly of FIG. 4.
Figure 6:
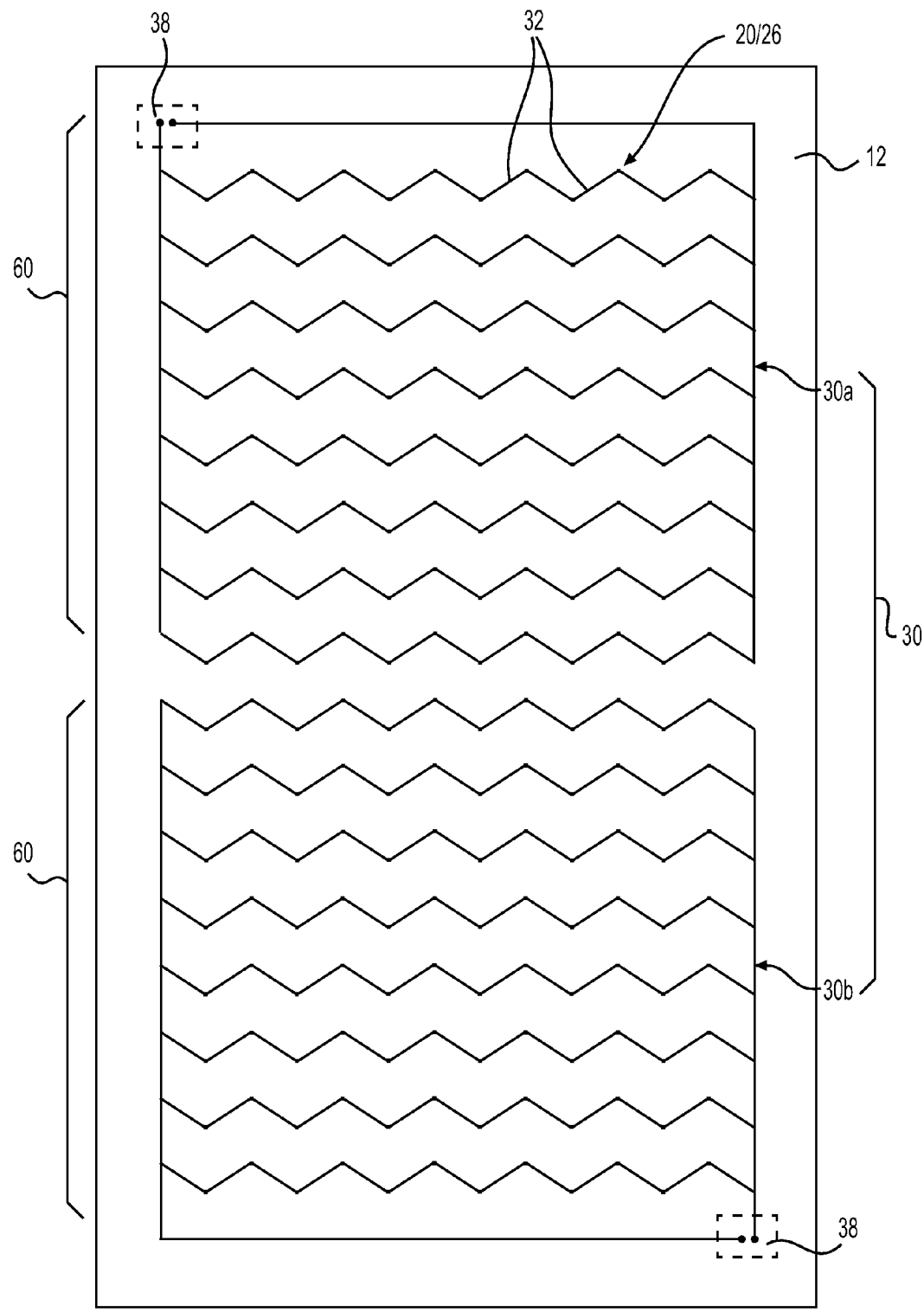
FIG. 6 is a rear plan view of an alternate embodiment of a substrate assembly having two arrays of light source assemblies.

The conductor pattern 30 provides electrical paths between the light source assemblies 20 and the junction box 38. In the embodiment illustrated in FIGS. 3, 4 & 5, the conductor pattern 30 includes a positive bus bar 34, a negative bus bar 36 and a plurality of interconnection traces 32 which connect, directly or indirectly, each light source assembly 20 to the bus bars 34, 36. In the embodiment of FIG. 4, the conductor pattern 30 electrically connects twenty-two strings of sixteen series-connected light source assemblies 20 in parallel. In other embodiments, the conductor pattern 30 can be designed to provide electrical paths for two or more arrays 60 of light source assemblies 20. As shown in FIG. 6, the conductor pattern 30 can comprise two halves 30*a*, 30*b*, each of which provide electrical paths for an array 60 of light source assemblies 20 to a junction box 38. As will be appreciated by a person skilled in the art, patterns other than those shown and/or described herein may be used to suit specific applications.

The conductor pattern 30 is formed of an electrically conductive metal such as silver or copper. The conductor pattern 30 can be applied onto the first surface 14 of the rigid sheet 12 by any suitable metalization process, which could, for example, include sputtering, galvanizing or screen printing a thick film. Alternatively, conductors, such as wires, ribbons and/or foils, can be attached to the rigid sheet 12 using a bonding agent such as epoxy and/or by soldering the conductors to metalizations on the rigid sheet 12 (e.g., metalized dots).

Unlike conventional compact light dispersing illumination panels, the conductor pattern 30 is sandwiched within the panel 2 (for example, in some embodiments, between the rigid sheet 12 and either a light redirecting optic 40 or a dispersing optic 50).

The conductor pattern 30 may also serve as a heat spreader by spreading the heat generated at the light source 24 away from the light source 24 via conduction, to be dissipated through the rigid sheet 12 and the light redirecting optic 40. Where the optical units 8 (comprising the light redirecting optic 40, the light source 24 and, where present, the dispersing optic 50) are sufficiently small, the interconnection traces 32 of the conductor pattern 30 may be capable of dissipating heat from the light source 24 fast enough to keep the light source 24 cool enough to operate efficiently. However, for larger optical units 8, the interconnection traces 32 may be insufficient for cooling the light source 24. More elaborate conductor patterns 30 that have heat spreader portions 70 electrically and thermally connected to the interconnection traces 32 may therefore be employed to cool larger optical units 8. The larger the optical unit 8, the greater the surface area of the conductor pattern 30 required.

Figure 7A:
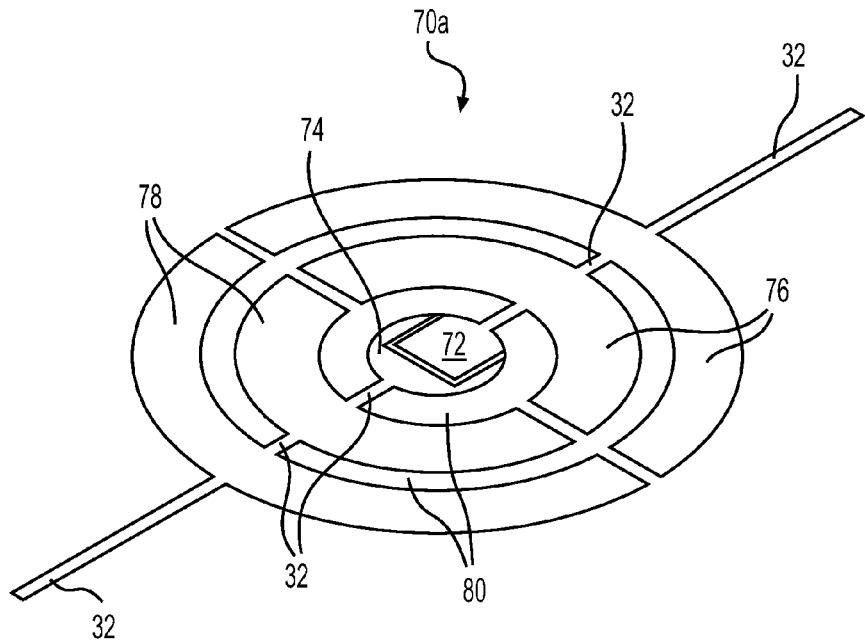
FIG. 7A is a perspective view of an embodiment of a heat spreader portion of a substrate assembly.
Figure 7B:
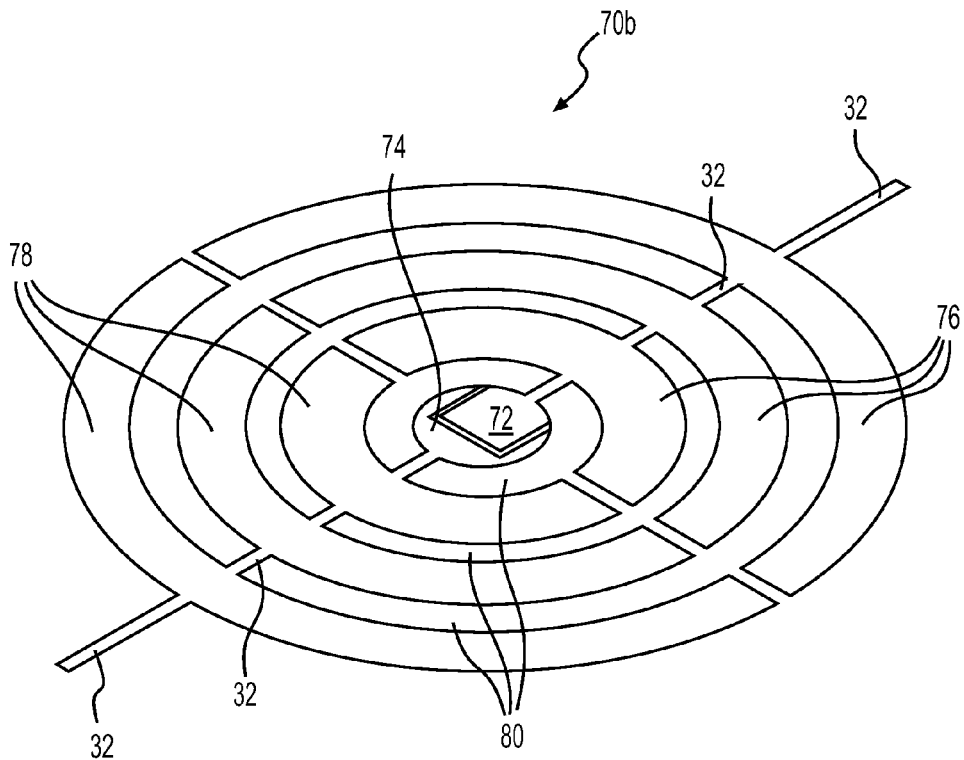
FIG. 7B is a perspective view of another embodiment of a heat spreader portion of a substrate assembly.

FIGS. 7A & 7B show substantially flat heat spreader portions 70*a*, 70*b* of conductor pattern 30. The heat spreader portion 70*a* has a positive half and a negative half. The positive half includes a positive terminus 72, positive arms 76 and interconnection traces 32 electrically and thermally connecting the positive terminus 72 and the positive arms 76. The negative half includes a negative terminus 74, negative arms 78 and interconnection traces 32 electrically and thermally connecting the negative terminus 74 and the negative arms 78. The positive terminus 72 is disposed proximate to the negative terminus 74 to allow their connection (e.g., by soldering) with the positive and negative contacts of the light source assembly 20. The interconnection traces 32 extending from the heat spreader portion 70*a* electrically connect the positive half of one heat spreader portion 70*a* to the negative half of the next heat spreader trace 70*a* of the string or a bus bar 34, 36. Gaps 80 are provided between arms 76, 78 to facilitate heat dissipation and to allow light to be sent therethrough by the light redirecting optic 40 to the dispersing optic 50. The heat spreader portion 70*a* is designed to allow light to be transmitted from the light redirecting optic 40 to the light dispersing optic 50 with little shading. The heat spreader portion 70*a* illustrated in FIG. 7A allows light in the light redirecting optic 40 to pass through rigid sheet 12 and the gaps 80 to the concentric lenses (e.g. toroidal lenses) of the light dispersing optic 50, shaded only by interconnection traces 32. The heat spreader portion 70*b* can be scaled to accommodate larger optical units 8 by increasing the number of positive and negative arms 76, 78, as shown in FIG. 7B. Such heat spreader portions 70*a*, 70*b* can be metalized onto the rigid sheet 12 or stamped from a sheet or foil of conductive material (commonly used in the fabrication of circuit boards) such as conductive metals (e.g., copper, gold or aluminum) and polymers loaded with conductive materials and bonded to the rigid sheet 12.

Figure 8A:
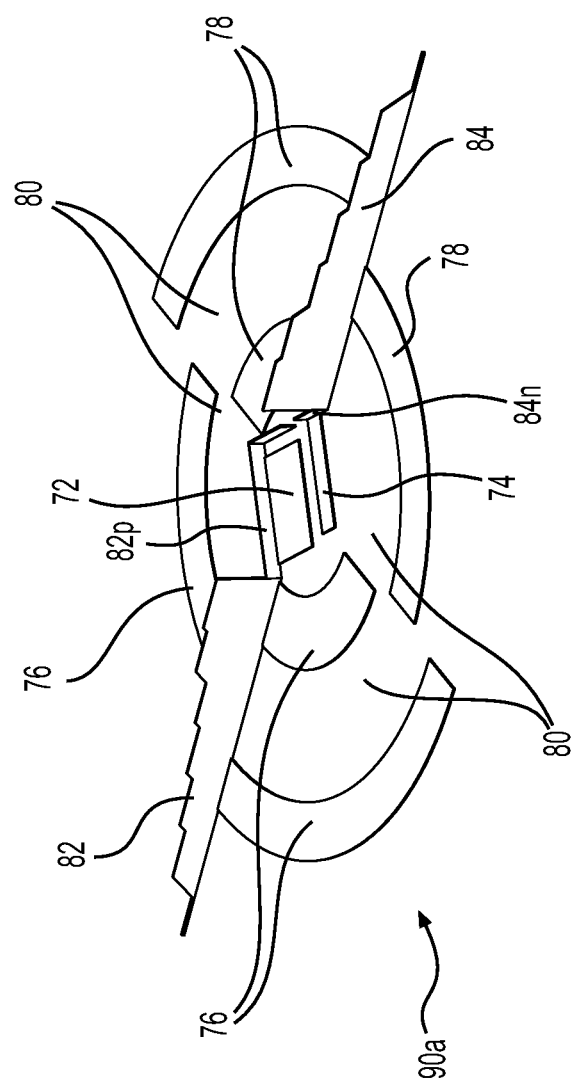
FIG. 8A is a perspective view of another embodiment of a heat spreader portion of a substrate assembly.
Figure 8B:
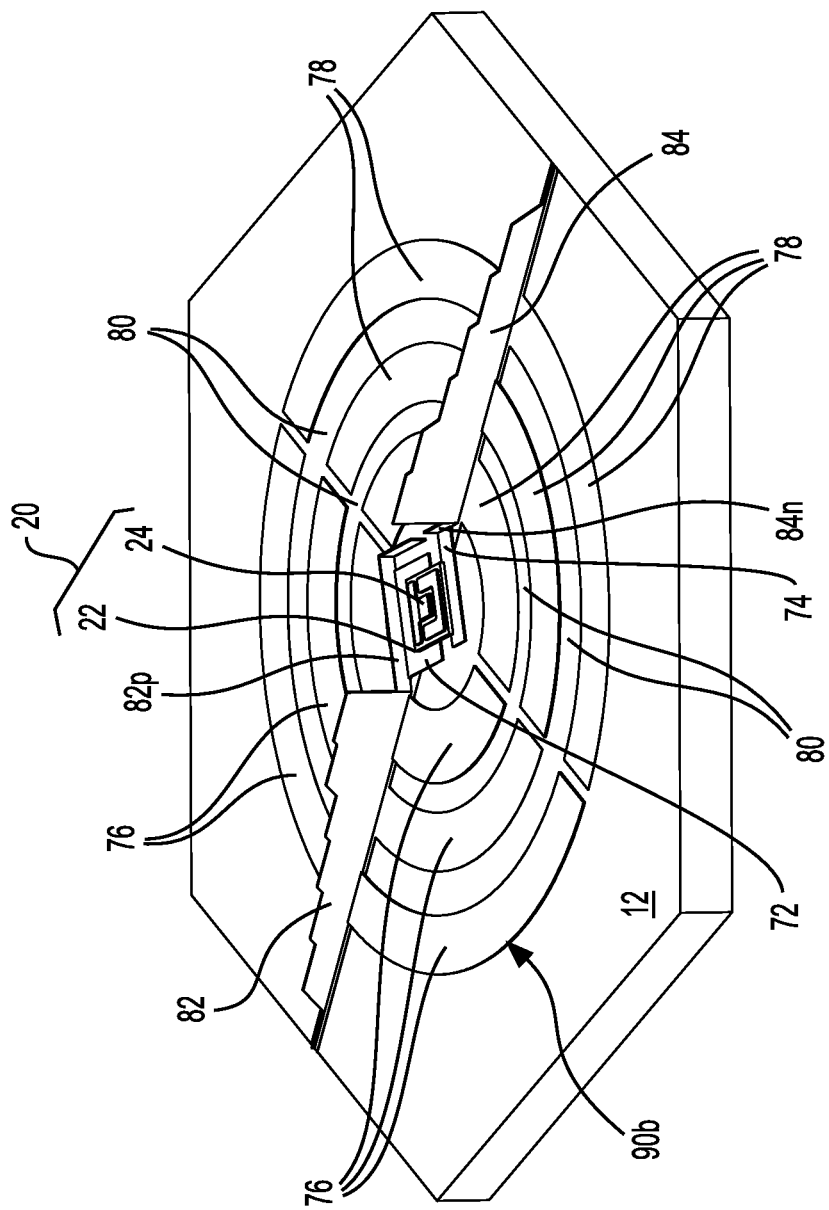
FIG. 8b is a perspective view of a substrate assembly including the heat spreader portion of FIG. 8A.
Figure 8C:
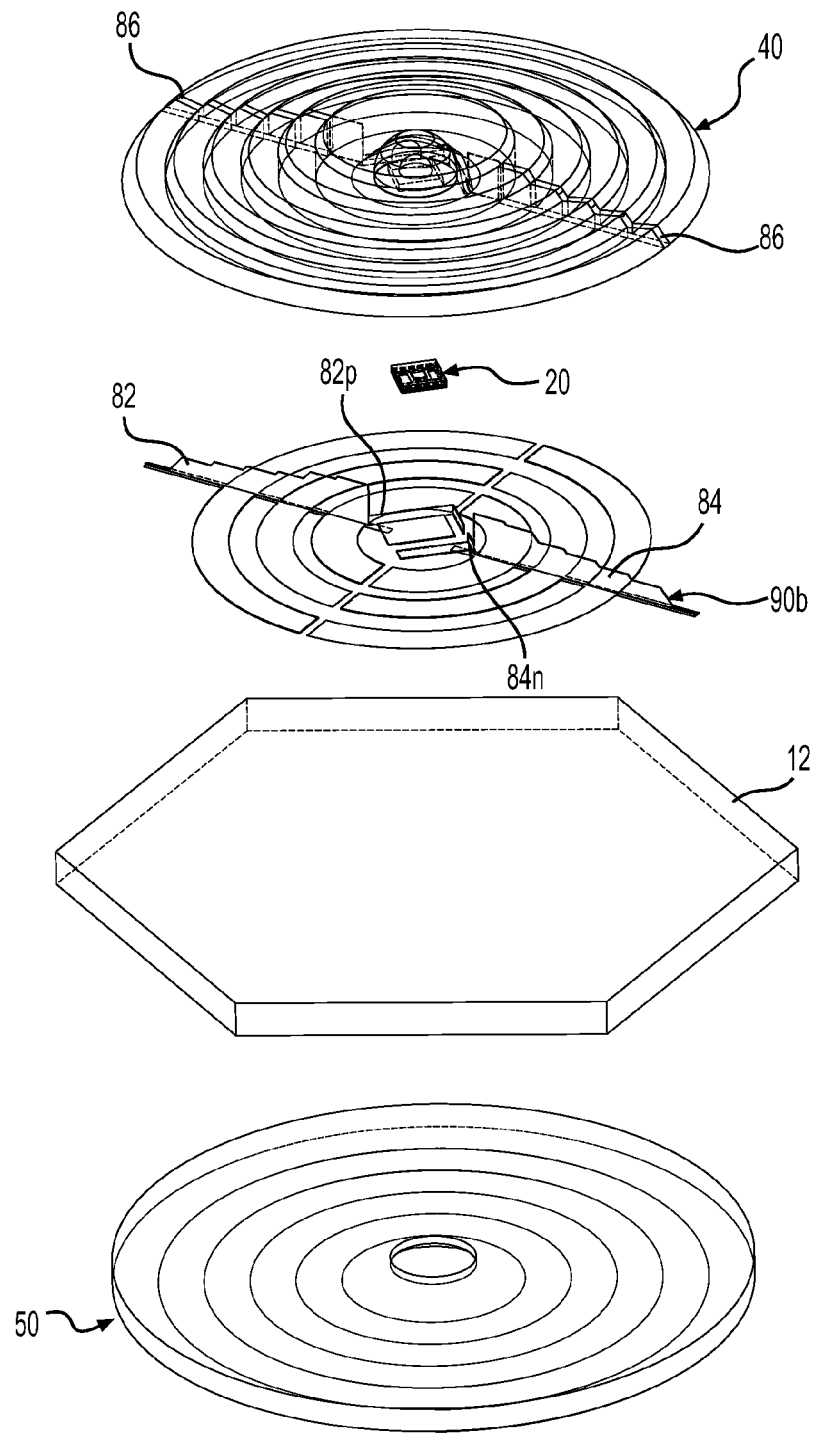
FIG. 8C is an exploded view of an embodiment of an optical unit including the heat spreader portion of FIG. 8A.

In another embodiment, the heat spreader portion 70 may have one or more fins 82, 84 extending outwardly from the first surface 14 of the rigid sheet 12. FIGS. 8A-8C show a heat spreader portion 90*a*, 90*b* that has positive arms 76, negative arms 78, a positive terminus 72 and a negative terminus 74, all of which lie flat against the rigid sheet. These portions the lie flat against the rigid sheet 12 can be metalized onto the rigid sheet 12 or can be attached to the rigid sheet 12 with an adhesive or soldered to metalizations on the rigid sheet 12. The heat spreader portion further has a positive fin 82 and a negative fin 84, which, in the illustrated embodiment, are attached to and extend perpendicularly from those portions that lie flat against the rigid sheet 12.

The heat spreader portion 90*a* shown in FIG. 8A can be stamped for a single sheet of conductive material and bent or folded to form the functional heat spreader portion 90*a*. Alternatively, each of the positive half and the negative half of the heat spreader portion 90*a* can be integrally formed, for example, by 3D printing onto the rigid sheet 12 or molding each half of the heat spreader portion 90*a* and attaching it to the rigid sheet 12 with an adhesive or by soldering to metalizations on the rigid sheet 12.

In the embodiment of FIG. 8B, the positive arms 76 and negative arms 78 of the heat spreader portion 90*b* are more densely packed thereby increasing the surface area over which heat can be dissipated. FIG. 8B also illustrates how the positive arms 76, negative arms 78, positive terminus 72 and negative terminus 74 lie flat against the rigid sheet 12 and the positive fin 82 and negative fin 84 extend perpendicularly from those portions that lie flat against the rigid sheet 12. This heat spreader portion 90*b* cannot be stamped from a single sheet of conductive material. Instead the parts that lie flat against the rigid sheet 12 can be metalized onto the rigid sheet 12 or stamped from a sheet of conductive material or otherwise formed and bonded to the rigid sheet 12, while the positive and negative fins 82, 84 must be separately stamped from a sheet of conductive material or otherwise formed and be soldered or attached to those portions that lie flat against the rigid sheet 12 with an electrically and thermally conductive adhesive. Alternatively, each of the positive half and the negative half of the heat spreader portion 90*b* can be integrally formed, for example, by 3D printing onto the rigid sheet 12 or molding each half of the heat spreader portion 90*b* and attaching it to the rigid sheet 12. As shown in FIG. 8B the light source assembly 20 can be mounted across the positive terminus 72 and the negative terminus 74 for connection with the positive terminus 72 and the negative terminus 74. The positive fin 82 and the negative fin 84 can have bent portions 82*p*, 84*n* to accommodate the light source assembly 20. The bent portions 82*p*, 82*n* should have a height from the rigid sheet that is short enough not to impede the transmission of light from the light source 24 to the light redirecting optic 40. The positive fin 82 electrically and thermally interconnects the positive arms 76 and the positive terminus 72. Similarly, the negative fin 84 electrically and thermally interconnects the negative arms 78 and the negative terminus 74. As shown in FIG. 8C, the light redirecting optic 40 can be provided with a groove 86 to accommodate the fins 82, 84. Use of such fins 82, 84 may reduce shading while increasing the surface area for dissipation of heat, and facilitate alignment of the light redirecting optic 40 with the light source assembly 20 and thereby the light source 24.

The conductor pattern 30 can additionally or alternatively serve as and/or include alignment markers to facilitate assembly of the panel apparatus 6. Alignment markers could, for example, be metalized dots (not shown). Alignment markers could, for example, facilitate the location of bond sites 26 for dispensing of a bonding agent for attachment of the light source assemblies 20 to the rigid sheet 12 and placement of the light source assemblies 20 on the rigid sheet 12. Alignment markers could also facilitate alignment of the light redirecting optic 40 and the light source assembly 20 (more particularly, the light source 24) of each optical unit 8. Where the optical unit 8 includes a dispersing optic 50 for receiving light from the light redirecting optic 40 to be provide a collimated beam of illuminating light, alignment markers could facilitate alignment of the dispersing optic 50 with the light redirecting optic 40.

Each light source assembly 20 includes a light source 24 for conversion of electricity into light. Each light source 24 can be mounted on a light source substrate 22 of the light source assembly 20 and is in electrical communication with the conductor pattern 30.

The light source 24 can be a high efficiency light source, such as a light emitting diode (LED) or an organic light-emitting diode (OLED). The light source 24 could also be a plasma light bulb, a fluorescent light bulb, or any other type of suitable light source. In some embodiments, the light source 24 can be an optical fiber transferring light from a remote originating source (not shown).

The light source assembly 20 can also include a bypass diode (not shown) to prevent the failure of a string of light source assemblies 20 connected in series due to failure or any other issues that would cause one of the series connected light source assemblies 20 to enter an open circuit state. Alternatively, the bypass diode may be separate from the light source assembly 20 and may be electrically connected directly to the interconnection traces 32 (e.g., by soldering the bypass diode to each end of a discontinuity in the interconnection traces).

The light source substrate 22 provides a medium on which electrical connections can be made between the electrical components of the light source assembly 20, including the light source 24 and, if present, the bypass diode, and the conductor pattern 30. Electrical components of the light source assembly 20 may be soldered to conductors on the light source substrate 22 to form electrical connections. The light source substrate 22 can be a surface mount substrate with positive and negative contacts on the backside of the substrate (i.e., the surface of the substrate opposite that on which the light source 24 is mounted) for electrical connection to the conductor pattern 30.

The light redirecting optics 40 are made of a light transmissive material and redirect light from their associated light source 24 travelling substantially laterally therein through the rigid sheet 12. Each light redirecting optic 40 has a central axis and rotational symmetry about the central axis 44. Light is guided within the light redirecting optics 40 by at least one reflection on at least one reflective surface 42. The at least one reflection on the at least one reflective surface 42 can be total internal reflections on surfaces that interface with materials having a lower index of refraction than the light redirecting optics 40, reflections on mirror coated surfaces of the light redirecting optics 40 or a combination thereof. The one or more reflective surfaces 42 can form concentric rings about the central axis 44, an example of which is shown in FIG. 3.

Each dispersing optic 50 is made of a light transmissive material and receives light from one or more reflective surfaces 42 of an associated light redirecting optic 40. Use of dispersing optics 50 may therefore allow for a thinner panel apparatus 6 than would otherwise be possible.

Non-limiting examples of light transmissive materials that may be used to form the rigid sheet 12, the light redirecting optics 40 and/or the dispersing optics 50 include glass, light transmissive polymeric materials such as rigid, injection molded poly(methyl methacrylate) (PMMA), polymethyl methacrylimide (PMMI), polycarbonates, cyclo-olefin polymers (COP), cyclo-olefin copolymers (COC), polytetrafluoroethylene (PTFE), or a combination of these materials. For example, the rigid sheet 12 can be a sheet of glass, and the light redirecting optics 40 and the dispersing optics 50 can be made of PMMA. Alternatively, the light redirecting optics 40 and/or the dispersing optics 50 can be made of a silicone rubber such as silicone having hardness, when cured, of at least 20 Shore A. Attachment of each light redirecting optic 40 and dispersing optic 50 to the substrate assembly 10 can be achieved by optically bonding the optics 40, 50 to the receiver substrate assembly 10 with an optical bonding agent, laser welding (where the rigid sheet 12 and the light redirecting optics 40 and dispersing optics 50 are made of polymers) or any other means known in the art. As an example, if the light redirecting optics 40 and the dispersing optics 50 are made of a polymeric material, they can be optically bonded to the glass rigid sheet 12 using an optical adhesive such as a silicone. Alternatively, the light redirecting optics 40 and the dispersing optics 50 can be 3D printed directly on the glass rigid sheet 12 or the surfaces of the substrate assembly 10 can be coated with a polymer, such as a silicone rubber, and the polymeric light redirecting optics 40 and dispersing optics 50 can be 3D printed thereon.

Figure 3:
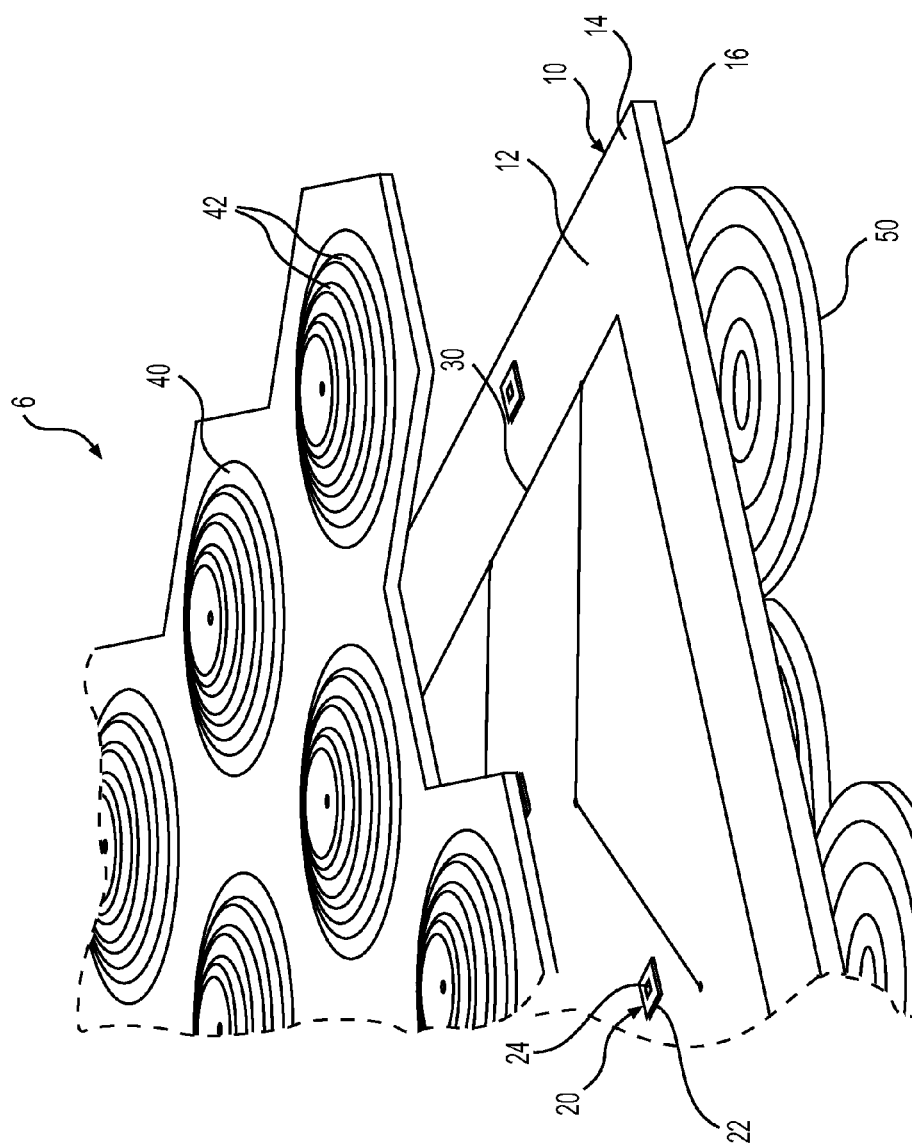
FIG. 3 is an exploded perspective view of the light-dispersing illumination panel apparatus of the light-dispersing illumination panel of FIG. 2.

Although FIGS. 2 and 3 show circular light redirecting optics 40 and circular dispersing optics 50, the light redirecting optics 40 and/or the dispersing optics 50 can be cropped into a tileable shape such as a square or a hexagon to eliminate dead space between optical units 8.

Figure 9:
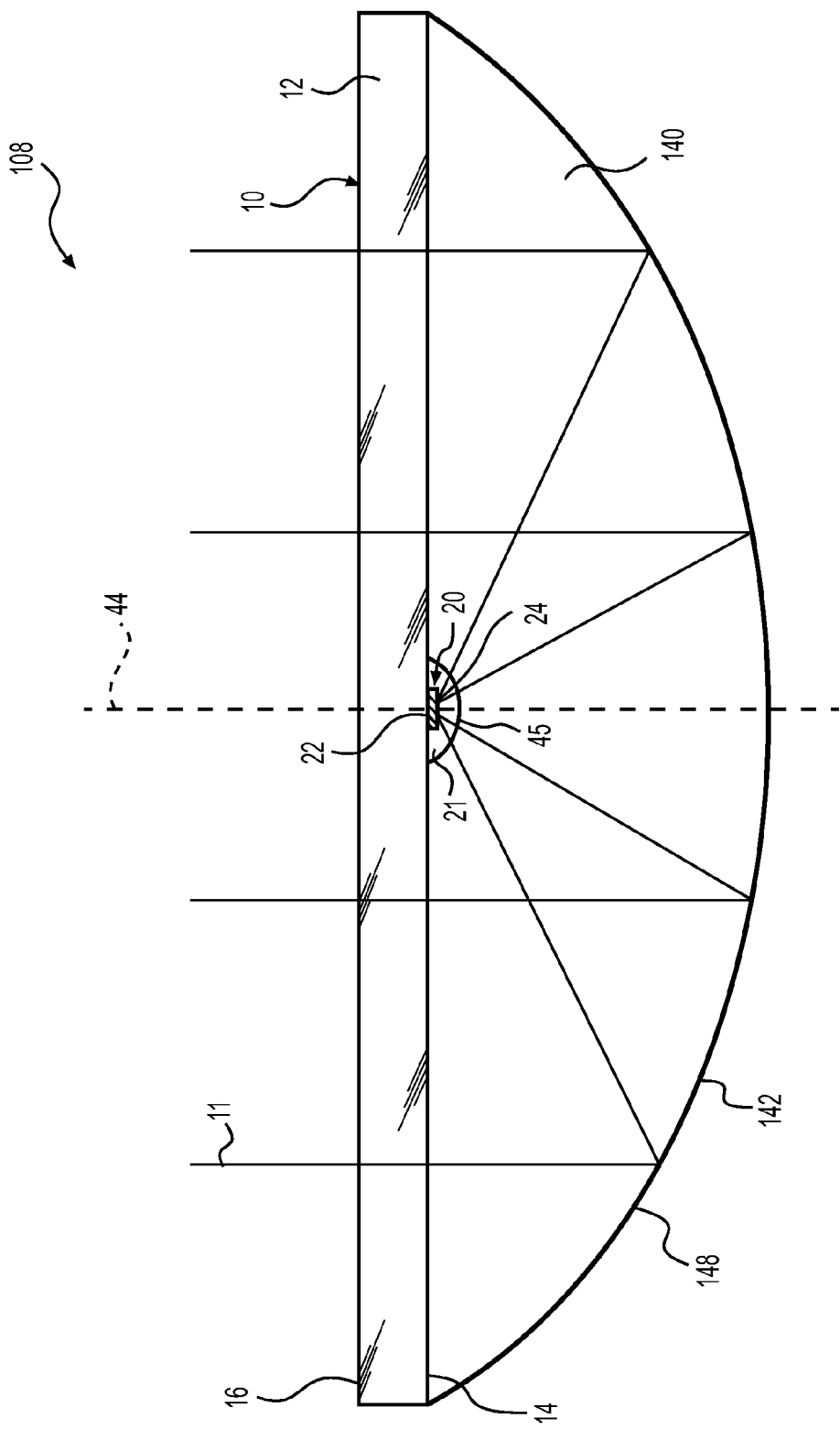
FIG. 9 is a cross-sectional view of an embodiment of an optical unit that has a curved redirecting optic.

FIG. 9 is a cross sectional view of an optical unit 108 having a parabolic light redirecting optic 140 optically bonded to the first surface 14 of a substrate assembly 10. In this embodiment the light source 24 is located at the focus of the parabola. Light from the light source 24 contacts the reflective surface 142 which is parabolic in shape and has a mirror coating 148 to reflect the light impinging thereon towards the rigid sheet 12 at an angle substantially normal to its first surface 14. The light passes through the rigid sheet 12 and exits the second surface 16 thereof as a substantially collimated beam of light 11.

In some embodiments, an envelope 21 may surround the light source 24, which is typically the hottest portion of an optical unit 108, and serve as thermal insulation to protect the physical integrity of the materials of the light redirecting optic 40. Where the light source assembly 20 is attached to a rigid sheet 12 made of glass, and the light redirecting optic is made of a polymer such as PMMA, it may only be necessary to provide an envelope 21 about the light source 24 on the side facing the light redirecting optic 40. The envelope 21 can be a dome (e.g., a hemisphere) of thermally insulating material, e.g., a polymer such as silicone or glass. The light redirecting optic 40 can therefore include a cavity 45 complementary in shape to the envelope 21 to house the envelope 21. Alternatively, the envelope 21 may be filled with a gas such as air contained by the cavity 45. An example of an envelope 21 and cavity 45, to thermally insulate the light redirecting optic 140 from heat generated at the light source 24, is shown in FIG. 9.

Figure 10:
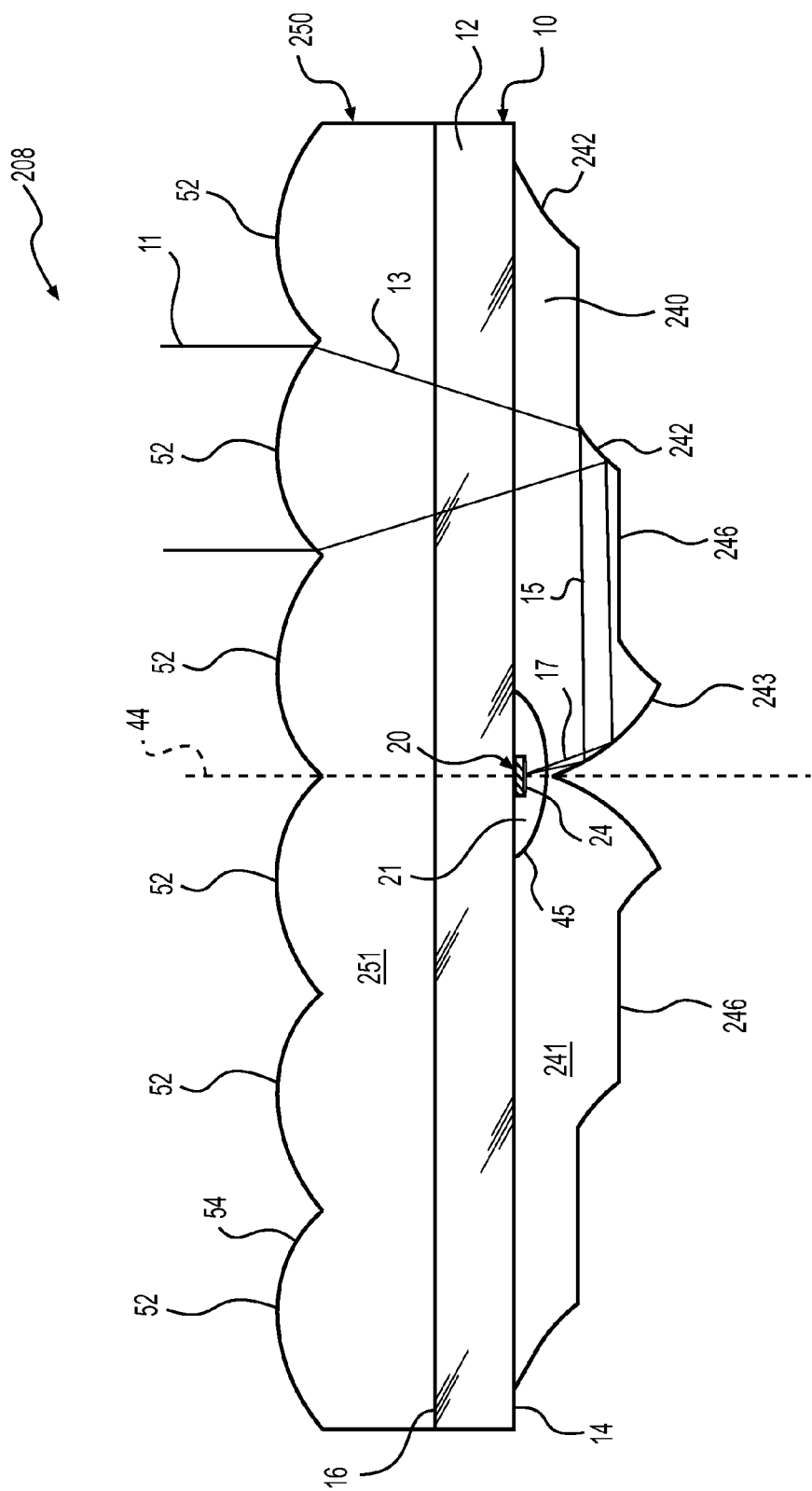
FIG. 10 is a cross-sectional view of an embodiment of an optical unit that has a dispersing optic and a redirecting optic, and the redirecting optic reflects light directly from a conditioning optic.

FIG. 10 is a cross sectional view of an optical unit 208 including a dispersing optic 250 optically bonded to the second surface 16 of a substrate assembly 10, and a light redirecting optic 240 optically bonded to the first surface 14 of the substrate assembly 10. In this embodiment, the dispersing optic 250 is formed of a plurality of lenses adjacent to one another and has rotational symmetry about the central axis 44. The lenses 52 can therefore form concentric rings about the central axis 44. Although FIG. 10 shows a dispersing optic 250 with three lenses 52 on either side of the central axis 44, greater or fewer lenses may be used depending on the dimensions of the optical unit 8 and the materials used.

The light redirecting optic 240 is stepped and substantially wedge-shaped in cross section, having a plurality of reflective surfaces 242 separated by step surfaces 246. A reflective surface 242 is positioned near the focus of each lens 52 of the dispersing optic 250.

A light source 24 is positioned at the focus of a parabolic surface of conditioning optic 243 of the light redirecting element 240. Light 17 leaves the light source 24 and is reflected by the conditioning optic 243 (via total internal reflection, or where the conditioning surface 243 is mirror coated, by specular reflection) within the light transmissive body 241 of the light redirecting optic 240 towards a reflective surface 242. The light 15 contacts the reflective surface 242 which reflects the light 15 towards its associated lens 52. (The light 15 may be reflected by the reflective surfaces 242 by total internal reflection or, where the reflective surfaces 242 are mirror coated, by specular reflection.) The reflected light 13 is transmitted through the light transmissive body 241 of the light redirecting optic 240 through the rigid sheet 12 and through the light transmissive body 251 of the dispersing optic 250 to the lenses 52. Where the conductor pattern 30 includes heat spreader portions (not shown) the reflective surfaces 242 redirect the light 13 through the gaps 80 of the heat spreader portions 70a, 70b, 90a, 90b. Light 13 is refracted by the lenses 52 and exits as a substantially collimated beam of light 11.

Figure 11:
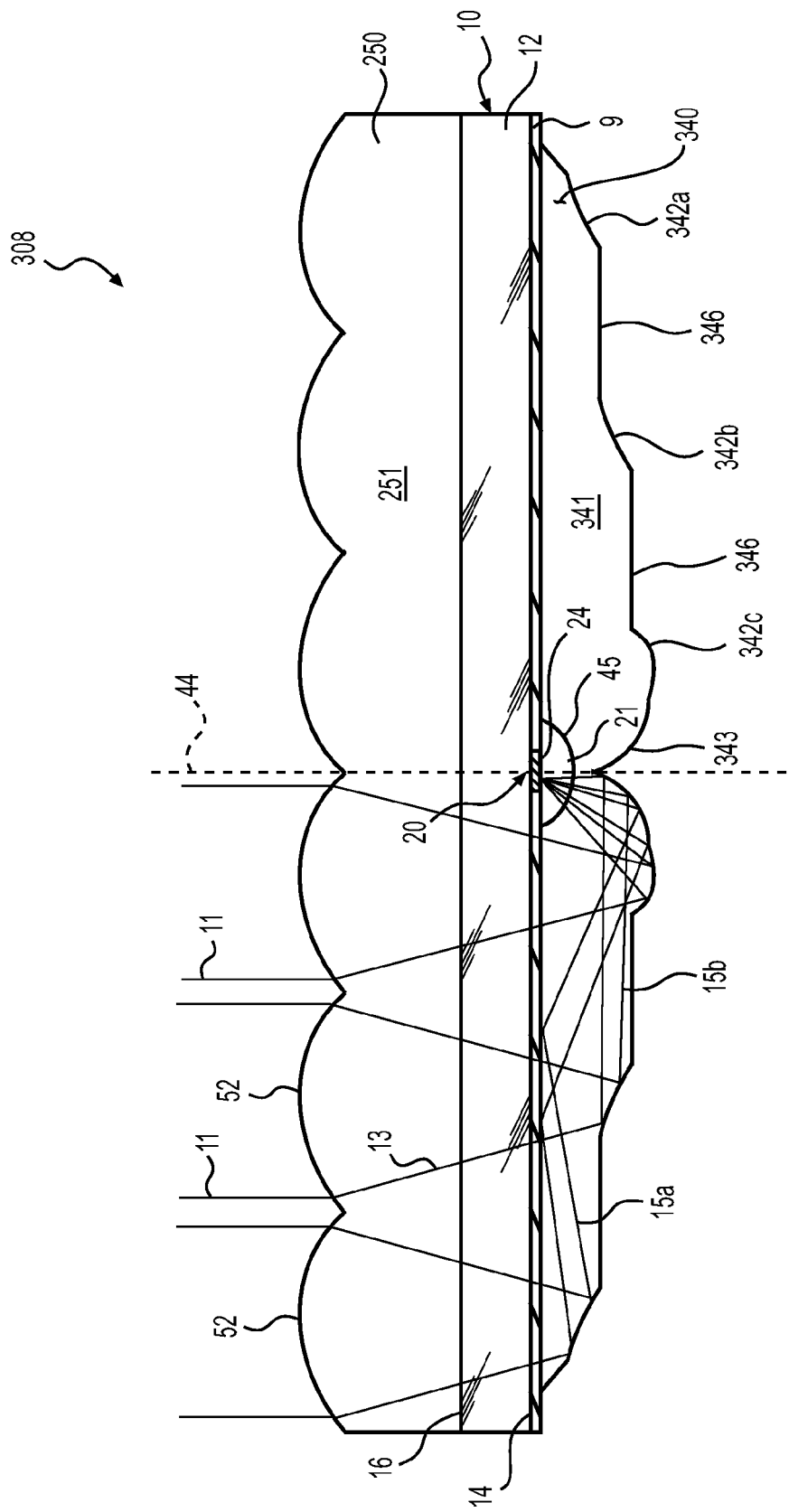
FIG. 11 a cross-sectional view of an embodiment of an optical unit in which the redirecting optic has reflecting surfaces that reflect light in three different paths.
Figure 12:
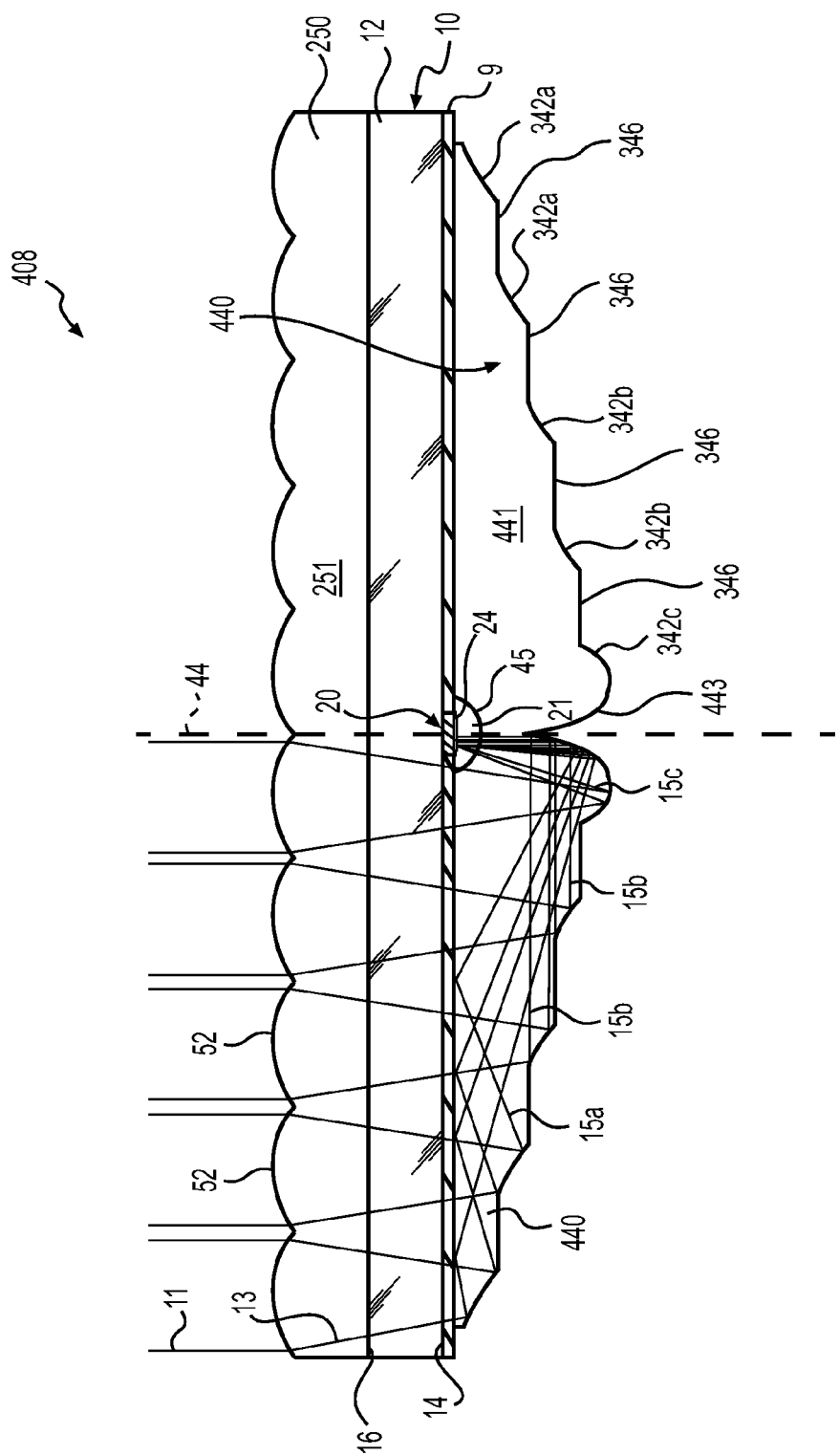
FIG. 12 a cross-sectional view of another embodiment of an optical unit in which the redirecting optic has reflecting surfaces that reflect light in multiple different paths.

In embodiments having multiple reflective surfaces 242, each reflective surface 242 may be identical to the others such that substantially all of the light in the optical unit 208 can be generally transmitted in the same direction from the conditioning surface 243, i.e., the light may be collimated as shown in FIG. 10. Alternatively, the reflective surfaces 242 may be different from one another, such that a reflective surface or a group of reflective surfaces receive light from one direction, and another reflective surface or another group of reflective surfaces receive light from another direction or directions As shown in FIGS. 11 and 12, an optical unit 308, 408 can include a dispersing optic 250, a substrate assembly 10, a low index film 9 and a light redirecting optic 340, 440. The low index film 9 has a lower index of refraction than the light transmissive body 341, 441. An example of a low index film material is a layer of a low index polymer or polytetrafluoroethylene (Teflon), which can be deposited onto the first surface 14 of the rigid sheet 12.

Light from the light source 24 is reflected off the conditioning surface 343, 443 through the light transmissive body 341, 441 of the light redirecting element 340, 440 towards either a reflecting surface 342b,c of the light redirecting optic 250 or the low index film 9. Light 15b having been reflected towards a reflecting surface 342b,c is reflected off that reflecting surface 342b,c towards the lenses 52. Light having been reflected towards the low index film 9 is reflected off the low index film 9 via total internal reflection (TIR) towards reflecting surface 342a. That light is reflected a second time off reflecting surface 342a towards the lenses 52. Light 13 having been reflected towards the lenses 52 is transmitted through the light transmissive body 341, 441 of the light redirecting optic 340, through the low index film 9, through the substrate assembly 10, and finally through the light transmissive body 251 of the light dispersing optic 250 to lenses 52. Light 13 is refracted by the lenses 52 and exits as a substantially collimated beam of light 11.

In these embodiments, the reflective surfaces 342a-342c are separated by step surfaces 346. FIG. 11 shows an optical unit 308 wherein each reflective surface 342a, 342b, 342c has a different profile in cross section. FIG. 12 shows an optical unit 308 having a group of two reflective surfaces 342a, a group of two reflective surfaces 342b and a reflective surface 342c. In an alternative embodiment similar to that of FIG. 12, any number of reflective surfaces 342a, 342b, 342c and corresponding lenses 52 may be included.

Figure 13:
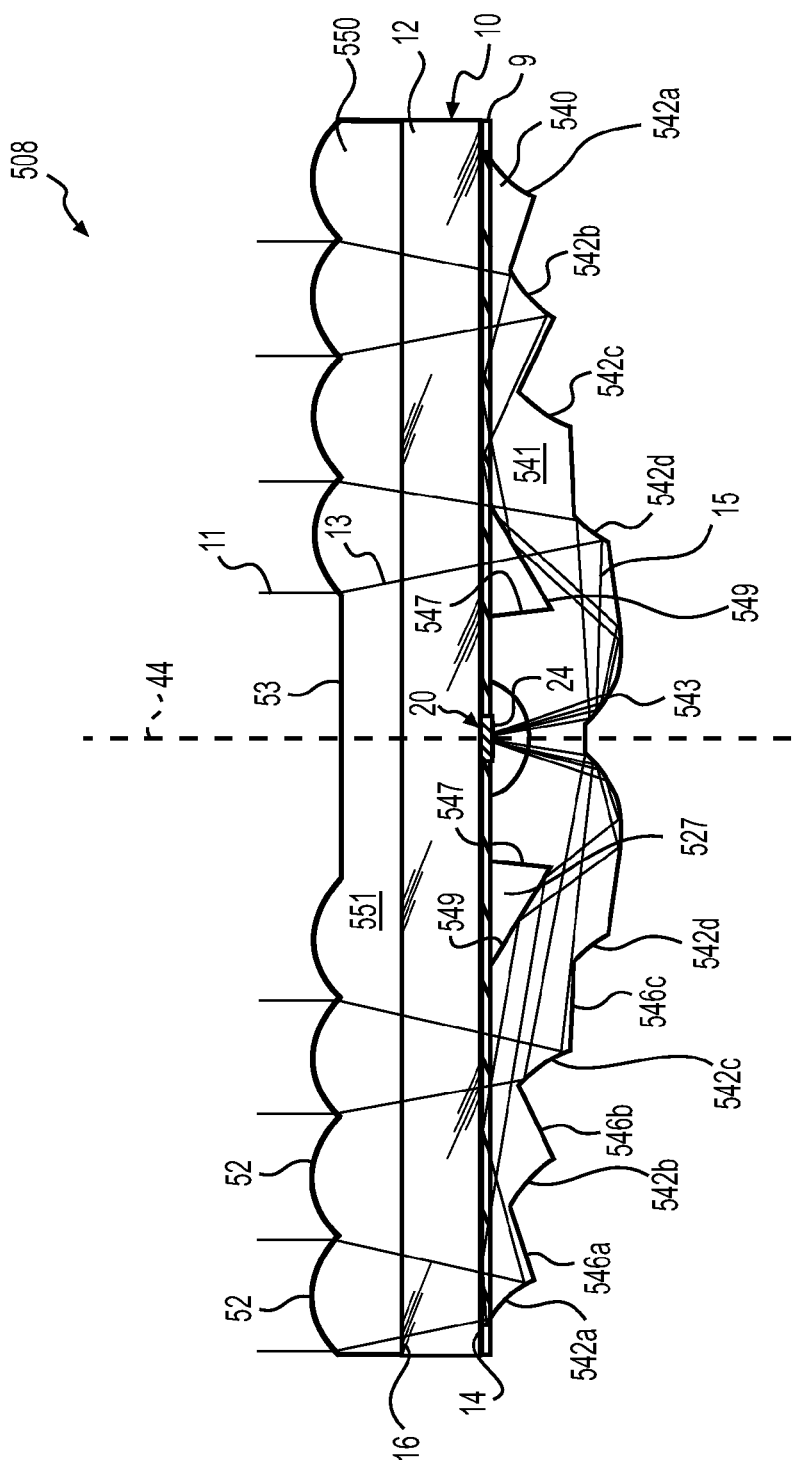
FIG. 13 is a cross-sectional view of an embodiment of an optical unit where the redirecting optic includes tertiary reflectors.

FIG. 13 shows a cross section of an optical unit 508 in which the light redirecting optic 540 includes a plurality of reflective surfaces 542a-542d, each reflective surface 542a-542d having a different profile in cross section from the others, separated by a plurality of step surfaces 546a-546c each step surface 546a-546c having a different profile in cross section from the others. The light redirecting optic 540 also includes tertiary reflector 547 with a secondary reflective surface 549. The gap 527 between the low index film 9 and the tertiary reflector 547 can be filled with a gas such as air or any suitable light transmissive material having a lower refractive index than the light transmissive body 541 of the light redirecting optic 540. The secondary reflective surfaces 549 can be mirror coated or they can reflect light by TIR.

The conditioning surface 543 receives the light from the light source 24 and may reflect the received light one or more times. The conditioning optic 543 can include a parabolic section in cross section and other curved or flat portions in order to disperse light received from the light source. Light 15 having been reflected off the conditioning optic 543 may be reflected towards a reflecting surface 542c,d or towards secondary reflective surface 549 of the tertiary reflector 547. Light reflected towards a reflecting surface 542c,d will reflect off that surface 542c,d, via total internal reflection (for example) toward a lens 52. Light reflected towards a secondary reflective surface 549 will reflect off that surface 549 towards the low index film 9. That light will reflect off the low index film 9 towards a reflecting surface 542a,b. Light reflected towards a reflecting surface 542a,b will reflect off that surface toward a lens 52.

Light 13 having been reflected towards a lens 52 will be transmitted through the light transmissive body 541 of the light redirecting optic 540, may be transmitted through the air gap forming the tertiary reflector 547, will be transmitted through the low index film 9, through the substrate assembly 10, and through the light transmissive body 551 of the light dispersing optic 550 to a lens 52. Light 13 is refracted by the lenses 52 and exits as a substantially collimated beam of light 11. The dispersing optic 550 may include dead space 53 in the vicinity of the central axis 44.

Figure 14:
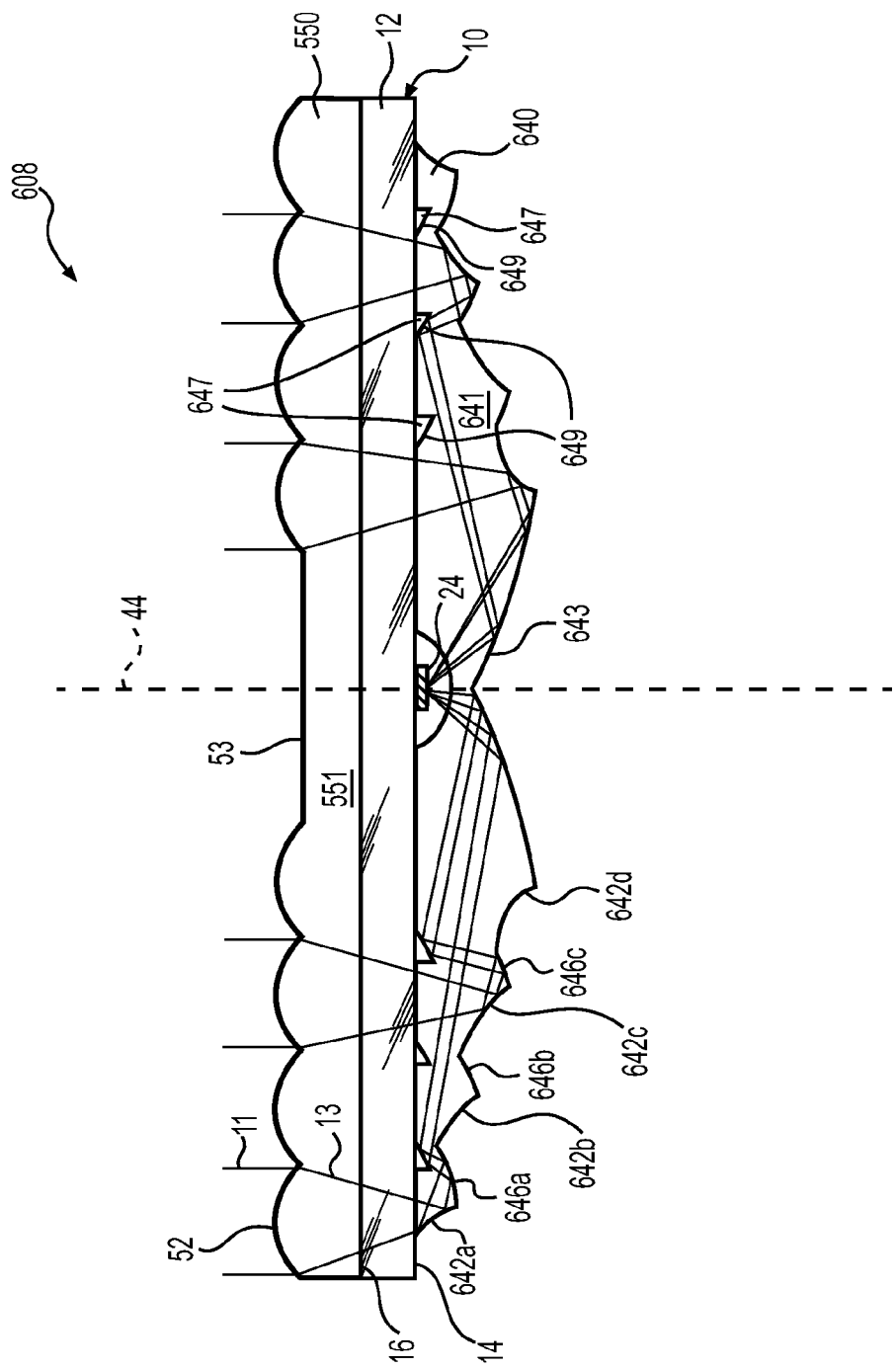
FIG. 14 is a cross-sectional view of another embodiment of an optical unit where the redirecting optic includes tertiary reflectors.

FIG. 14 is a cross sectional view of an optical unit 608 generally similar to that of FIG. 13. In this embodiment the light redirecting optic 640 includes a plurality of reflective surfaces 642a-642d, each reflective surface 642a-642d having a different profile in cross section from the others, separated by a plurality of step surfaces 646a-646c each step surface 646a-646c having a different profile in cross section from the others. The step surfaces 646a-636c, unlike those described in earlier embodiments, are also reflective. Additionally, the light redirecting optic 640 includes a plurality of tertiary reflectors 647 with secondary reflective surfaces 649, opposite the step surfaces 646a-646c. For every reflective surface 642a-642c, excluding the reflective surfaces 642d nearest the central axis, there is a corresponding secondary reflective surface 649.

In this embodiment, light exits the light source of the light source assembly 24 and reflects off the conditioning surface 643 via, for example, total internal reflection. Light 15 having been reflected off the conditioning optic 643 may be reflected towards a secondary reflective surface 649 of one of the tertiary reflectors 647 off of which it is reflected towards a step surface 646a-c. Light is then reflected off the step surface 646a-c towards a corresponding reflective surface 642a-c, off of which it is reflected toward a lens 52. Light 13 having been reflected towards a lens 52 will be transmitted through the light transmissive body 641 of the light redirecting optic 640, may be transmitted through the air gap forming the tertiary reflector 647, will be transmitted through the substrate assembly 10, and through the light transmissive body 551 of the light dispersing optic 550 to a lens 52. Light 13 is refracted by the lenses 52 and exits as a substantially collimated beam of light 11. The dispersing optic 650 may include dead space 53 in the vicinity of the central axis 44.

Light 15 having been reflected off the conditioning optic 643 may also be reflected towards the reflecting surface 642d. Light 13 reflecting off the reflecting surface 642d is dispersed and transmitted through the light transmissive body of the light redirecting optic 640, through the rigid sheet 12, through the light transmissive body 551 of the light dispersing optic 550 towards a lens 52 thereof. Light 13 is refracted by the lenses 52 and exits as a substantially collimated beam of light 11.

Figure 15:
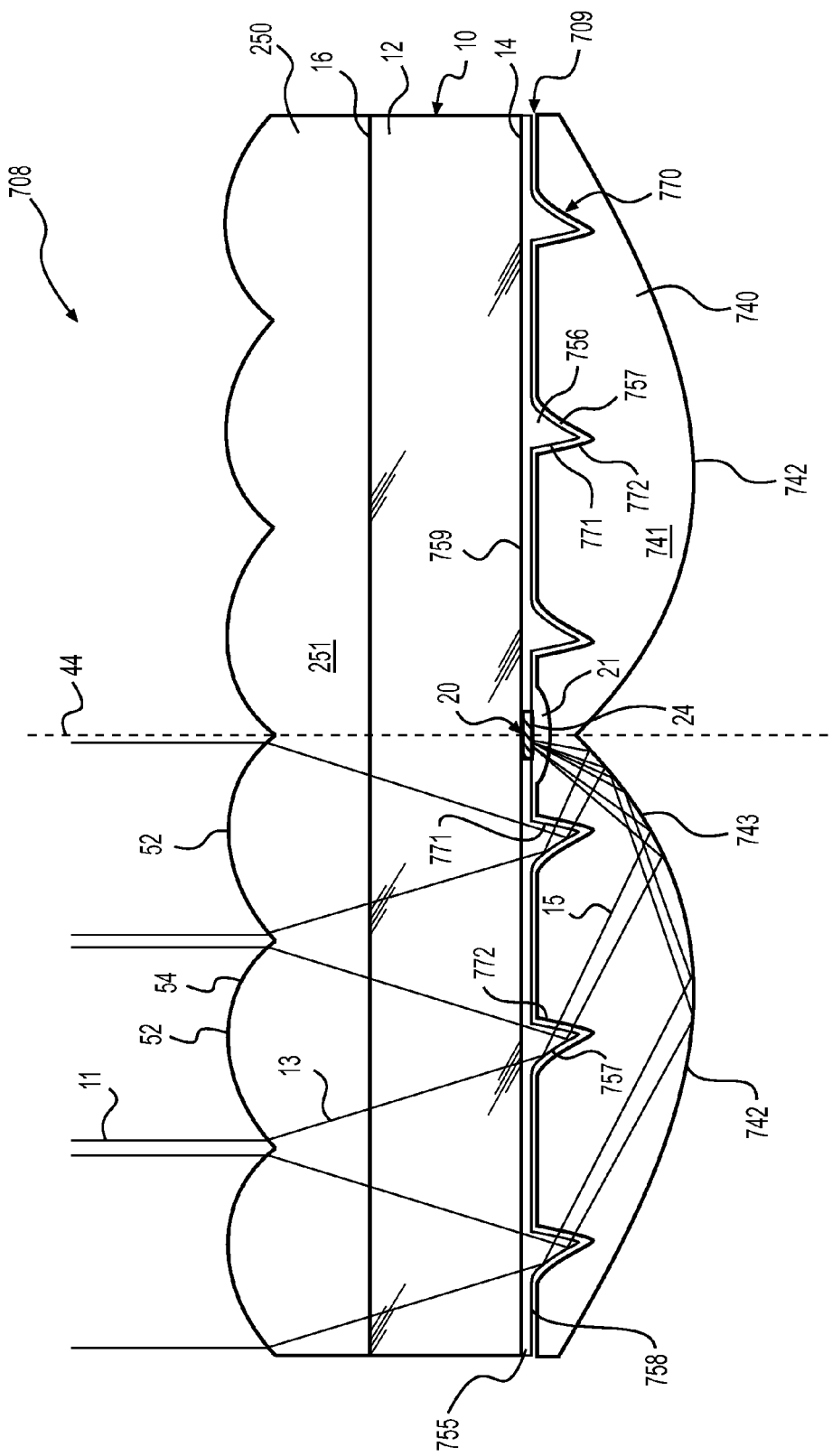
FIG. 15 is a cross-sectional view of an embodiment of an optical unit that has a secondary redirecting optic between the substrate assembly and the redirecting optic.

FIG. 15 shows a cross section of an optical unit 708 having a dispersing optic 250, a receiver substrate assembly 10, a secondary redirecting optic 755, a low index film 709, and a primary light redirecting optic 740. The secondary redirecting optic 755 can be made of light transmissive materials including glass, polymeric materials such as injection molded poly(methyl methacrylate) (PMMA), polymethyl methacrylimide (PMMI), polycarbonates, cyclo-olefin polymers (COP), cyclo-olefin copolymers (COC), polytetrafluoroethylene (PTFE), or silicones. In this embodiment, the secondary redirecting optic 755 is assembled onto the first surface 14 of the rigid sheet 12, the planar surface 759 of the secondary redirecting optic 755 being optically bonded thereto. The non-planar surface 758 of the secondary redirecting optic 755 includes a plurality of secondary redirecting elements 756 with secondary redirecting surfaces 757, and is coated by a low index film 709, such that the light is reflected by a secondary redirecting surface 757 via TIR. Alternatively, the secondary redirecting surfaces 757 may be coated with a reflective material, which may be more economical than coating the entire non-planar surface 758 with a low index film 709.

The primary light redirecting optic 740 includes a plurality of indentations 770 shaped to house the secondary redirecting elements 756. The primary light redirecting optic 740 can be assembled onto and optically bonded to the secondary redirecting optic 755 using optical adhesive such as silicone. The primary light redirecting optic further includes a reflective surface 742 that is continuous with a conditioning surface 743. Light from the light source 20 is reflected by the conditioning surface 743, off of which it is reflected through the light transmissive body 741 of the light redirecting element 740 towards a secondary redirecting surface 757 of one of the secondary redirecting elements 755. Each secondary redirecting surface 757 is located in front of a focus of one of the lenses 52. Light is reflected off a secondary redirecting surface 757 through the light transmissive body of the secondary redirecting optic 755, through the rigid sheet 12, and the through the light transmissive body 251 of the light dispersing element 250 towards a lens 52. Light 13 is refracted by the lenses 52 and exits as a substantially collimated beam of light 11.

Figure 16:
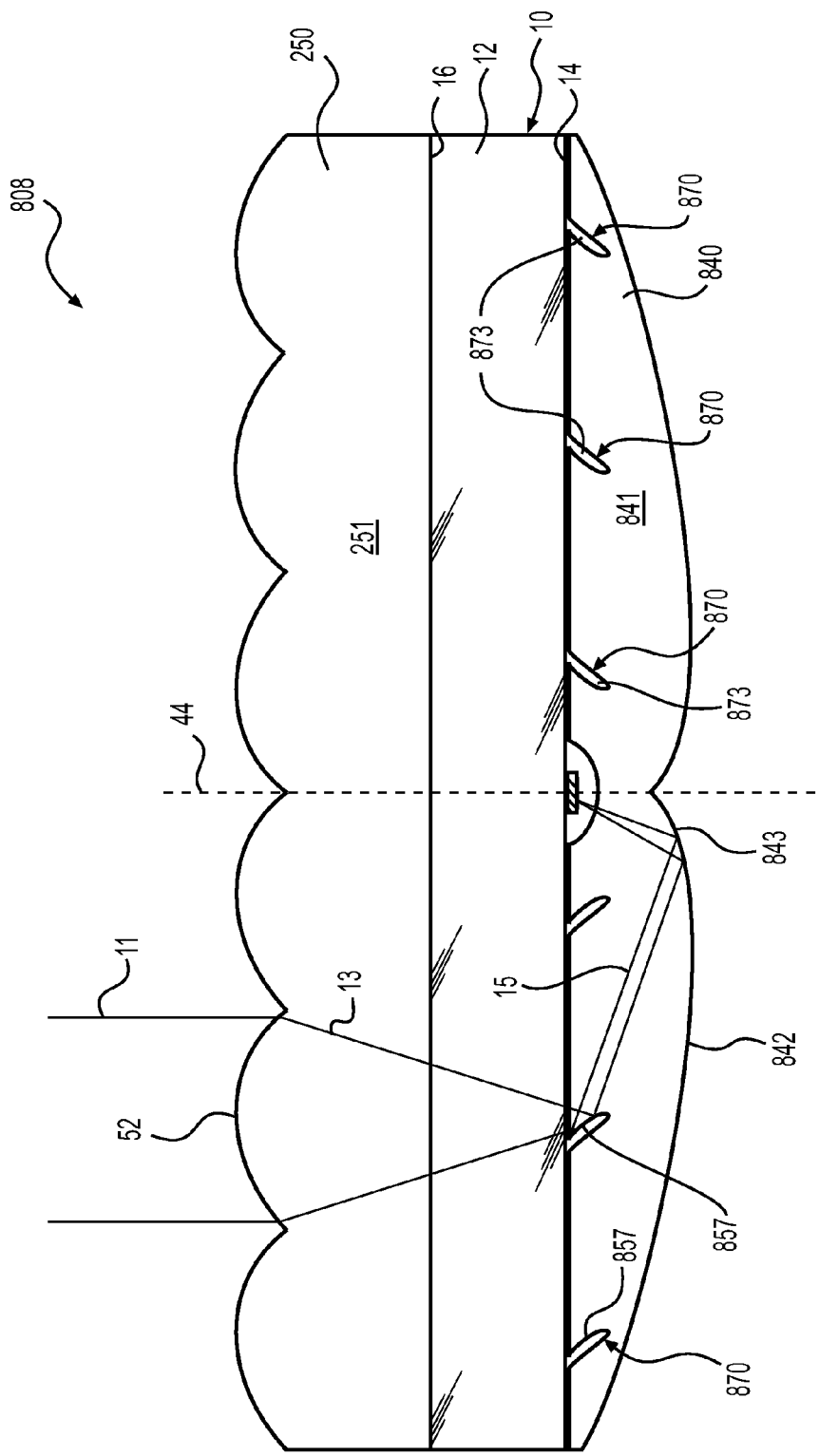
FIG. 16 is a cross-sectional view of another embodiment of an optical unit in which the redirecting optic has tertiary reflectors.

FIG. 16 shows a cross section of an embodiment of an optical unit 808 in which the path of light is generally similar to that of FIG. 15. However, in this embodiment, the light redirecting optic 840 is made with a plurality of tertiary reflectors 870 including redirecting surfaces 857. When the light redirecting optic 840 is assembled onto the first surface 14, air fills the gap 873 between the first surface 14 and the tertiary reflector 870. In an alternative embodiment, the gap 873 can be filled with any suitable material having a refractive index lower than that of the light transmissive body 841.

In this embodiment, light from the light source is reflected by the conditioning surface 843 through the light transmissive body 841 of the light redirecting optic 840 towards a redirecting surface 857 of one of the tertiary reflectors 870. Each redirecting surface 857 is positioned in front of the focus of one of the lenses 52. Light is reflected by a redirecting surface 857 by TIR through the rigid sheet 12 and the light transmissive body 251 of the light dispersing optic 250. Light 13 is refracted by the lenses 52 and exits as a substantially collimated beam of light 11.

Figure 17:
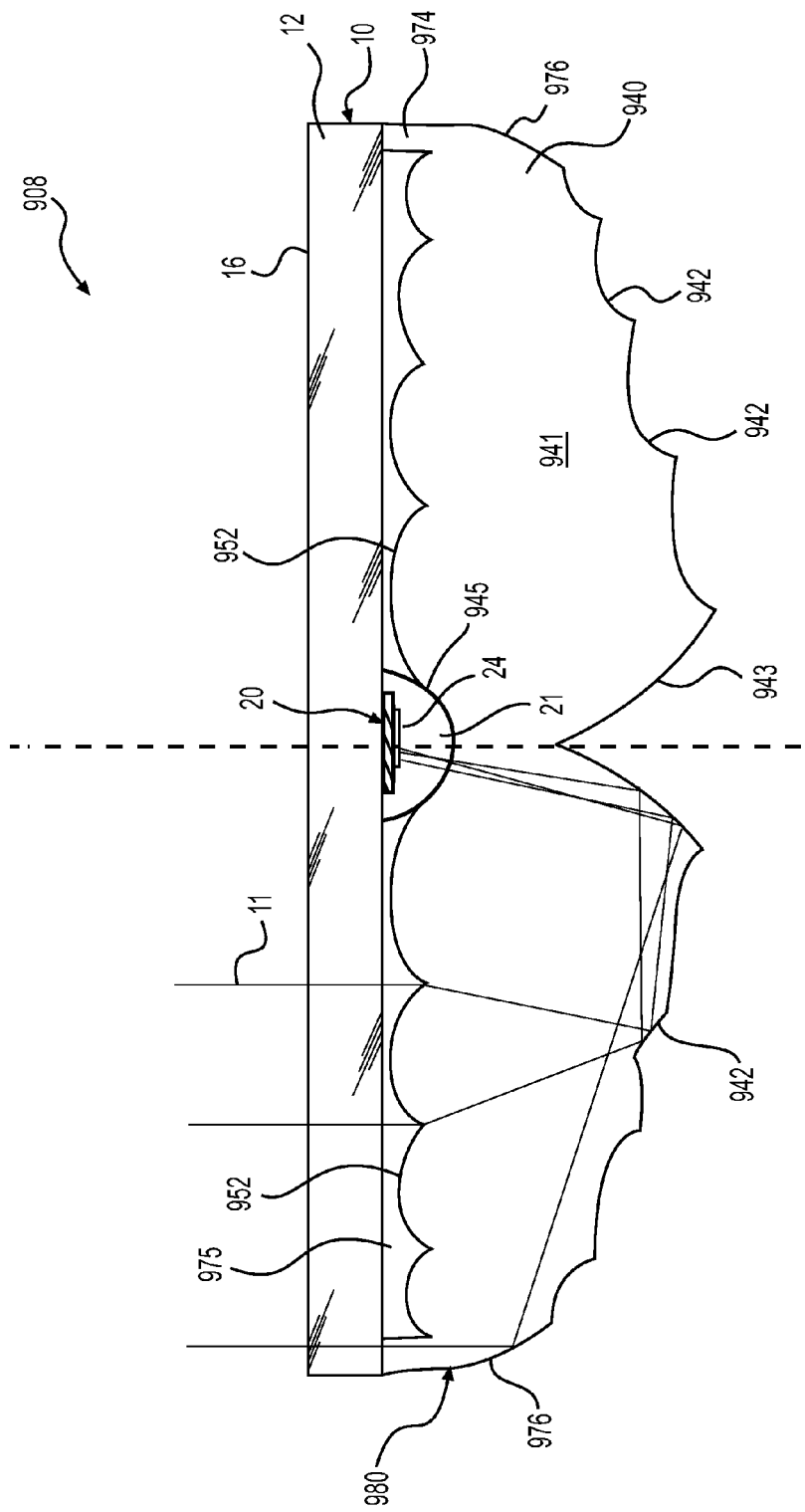
FIG. 17 is a cross-sectional view of an embodiment of an optical unit in which the redirecting optic includes lenses.

FIG. 17 shows a cross section of an optical unit 908 in which the light redirecting optic 940 includes a plurality of lenses 952 and reflective surfaces 942, and is attached to the rigid sheet 12 by means of optical attachment features 974. The optical attachment features can be optically and mechanically bonded, by means of an optical adhesive, to the first surface 14 of the rigid sheet 12. Likewise, the envelope 21, which in this embodiment must be made of a solid, optically transmissive material such as silicone, is mechanically and optically bonded to a cavity 945 in the light redirecting optic 940.

In this embodiment, light from the light source may be reflected by the conditioning surface 943 through the light transmissive body 941 of the light redirecting optic 940 towards a reflective surface 942. Each reflective surface 942 is positioned in front of the focus of one of the lenses 952. Light is reflected by the conditioning surface 943 (by TIR for example) through the light transmissive body of 941 of the light redirecting optic 940 to a lens 952. Light is then refracted by the lens 52 as a substantially collimated beam of light 11 which is transmitted through the layer 975 (which in some embodiments may be air or any suitable light transmissive material) and then through the rigid sheet 12. The lenses 952 are largest near the central axis 44 and smallest near the peripheral edge 980 of the optical unit 908. This is to adjust the focal lengths of the lenses 952 so that the overall thickness of the light redirecting optic 940 may be reduced.

Light from the light source may be reflected by the conditioning surface 943 through the light transmissive body 941 of the light redirecting optic 940 to reflective surface 976 and then by reflective surface 976 through the body of the optical attachment feature 974 and then through the rigid sheet.

Figure 18:
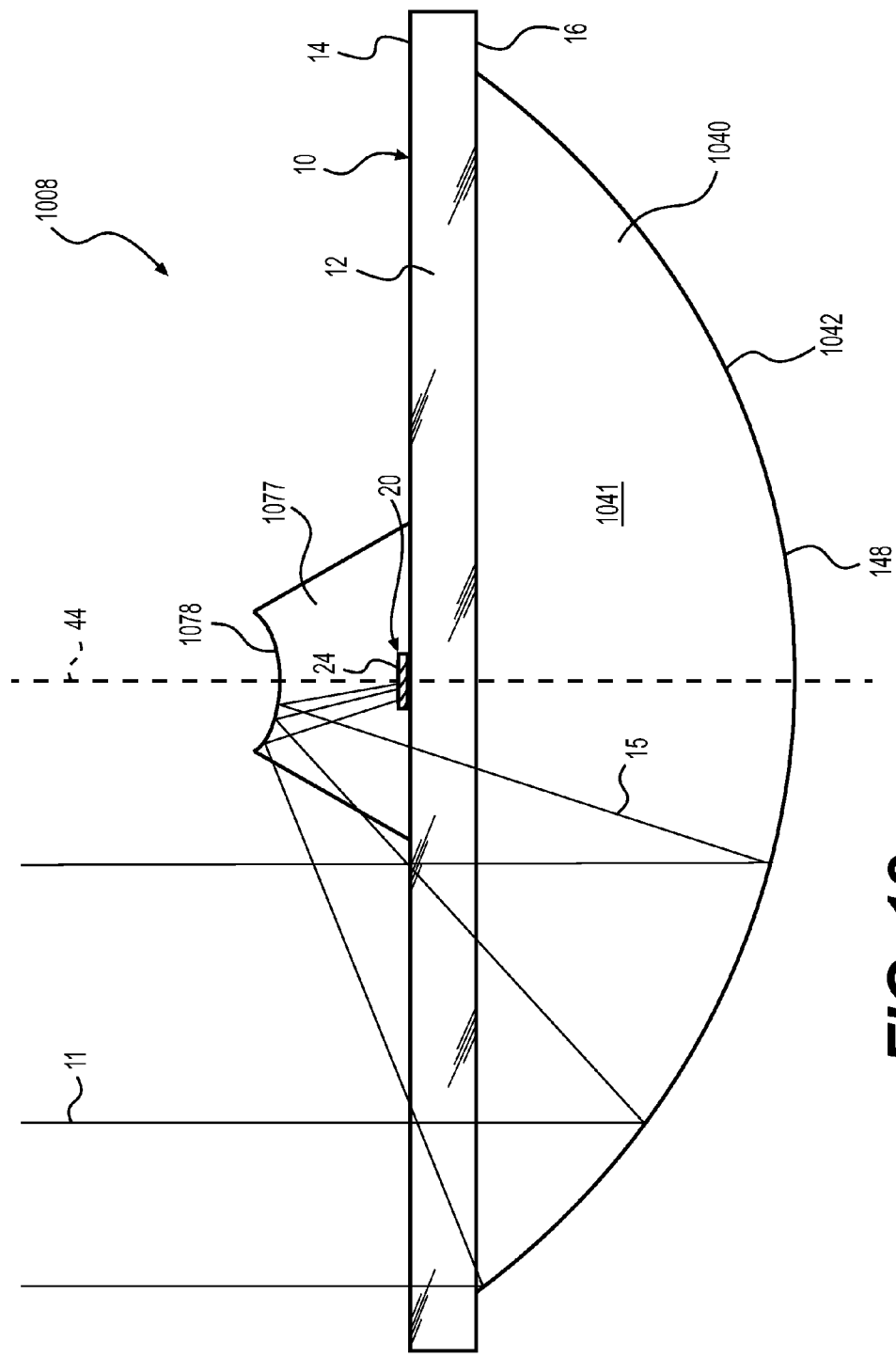
FIG. 18 is a cross-sectional view of an embodiment of an optical unit that has the substrate assembly on the second surface of the rigid sheet.

FIG. 18 shows a cross section of an optical unit 1008 having a parabolic light redirecting optic 1040 optically bonded to the second surface 16 of a substrate assembly 10. In this embodiment, light from the light source 20 is reflected by a mirror coated hyperbolic surface 1078 of a secondary optic 1077 through the rigid sheet 12 and the light transmissive body 1041 of a light redirecting optic 1040 toward a reflective surface 1042 thereof. The reflective surface 1042 is a parabolic section in cross-section, has a mirror coating 148 to reflect the light impinging thereon. The focus of the parabola is located behind the hyperbolic surface 1078 such that light 15 from the light source having been reflected off the hyperbolic surface 1078 reflects of off the parabolic surface as a substantially collimated beam of light 11. In this embodiment, the conductor pattern 30 and light source assemblies 20 are assembled onto the first surface 14 of the rigid sheet 12.

Figure 19:
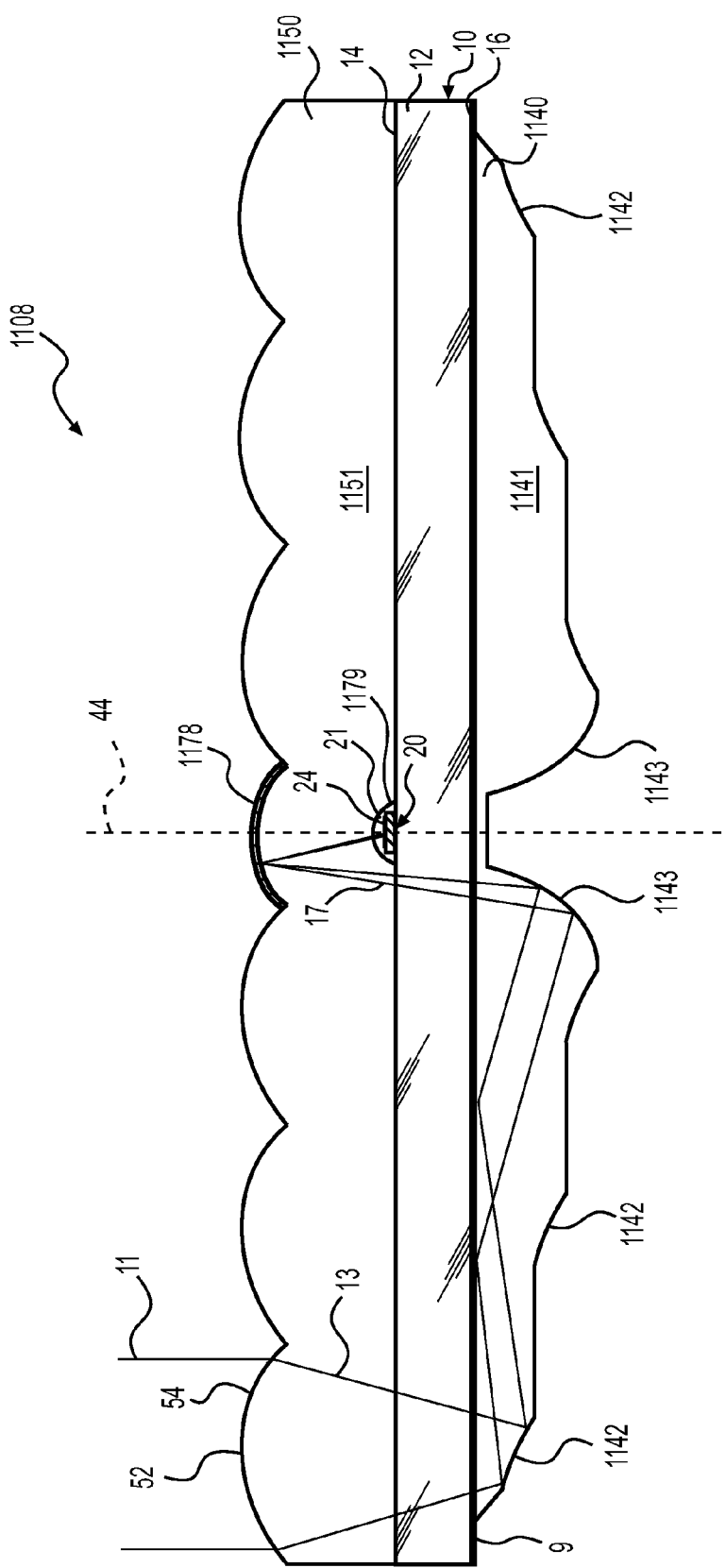
FIG. 19 is a cross-sectional view of another embodiment of an optical unit that has the substrate assembly on the second surface of the rigid sheet.

FIG. 19 is a cross sectional view of an optical unit 1108 having the light redirecting optic 1140 assembled onto the second surface 16 of the rigid sheet 12 and the conductor pattern 30 and the light source assembly 20 on the first surface 14 of the rigid sheet 12. In this embodiment the dispersing optic 1150 includes a secondary reflector surface 1178 and a cavity 1179 for housing the envelope 21, which in this embodiment extends from the first surface 14 of the rigid sheet 12, covering the light source 24 and the light source assembly 20.

In this embodiment, light 17 from the light source 24 is reflected by the secondary reflector surface 1178 through the light transmissive body 1151 of the light dispersing optic 1150, through the rigid sheet 12, and through the light transmissive body 1141 of the light redirecting optic 1140 towards conditioning surface 1143. The conditioning surface 1143 reflects the light within the light transmissive body 1141 of the light redirecting optic 1140 (via TIR off the second surface 16 of the rigid sheet 12) towards one of the reflective surfaces 1142. The reflective surfaces 1142 are each positioned in front of a focus of one of the lenses 52. The reflective surface 1142 reflects the light 13 through the light transmissive body 1141 of the light redirecting optic 1140, through the rigid sheet 12 and through the light transmissive body 1151 of the light dispersing element 1150. Light 13 is refracted by the lenses 52 and exits as a substantially collimated beam of light 11. Reflections on the secondary reflector surface 1178 may be TIR or specular reflections off a mirror coating applied to the secondary reflector surface 1178.

Figure 20:
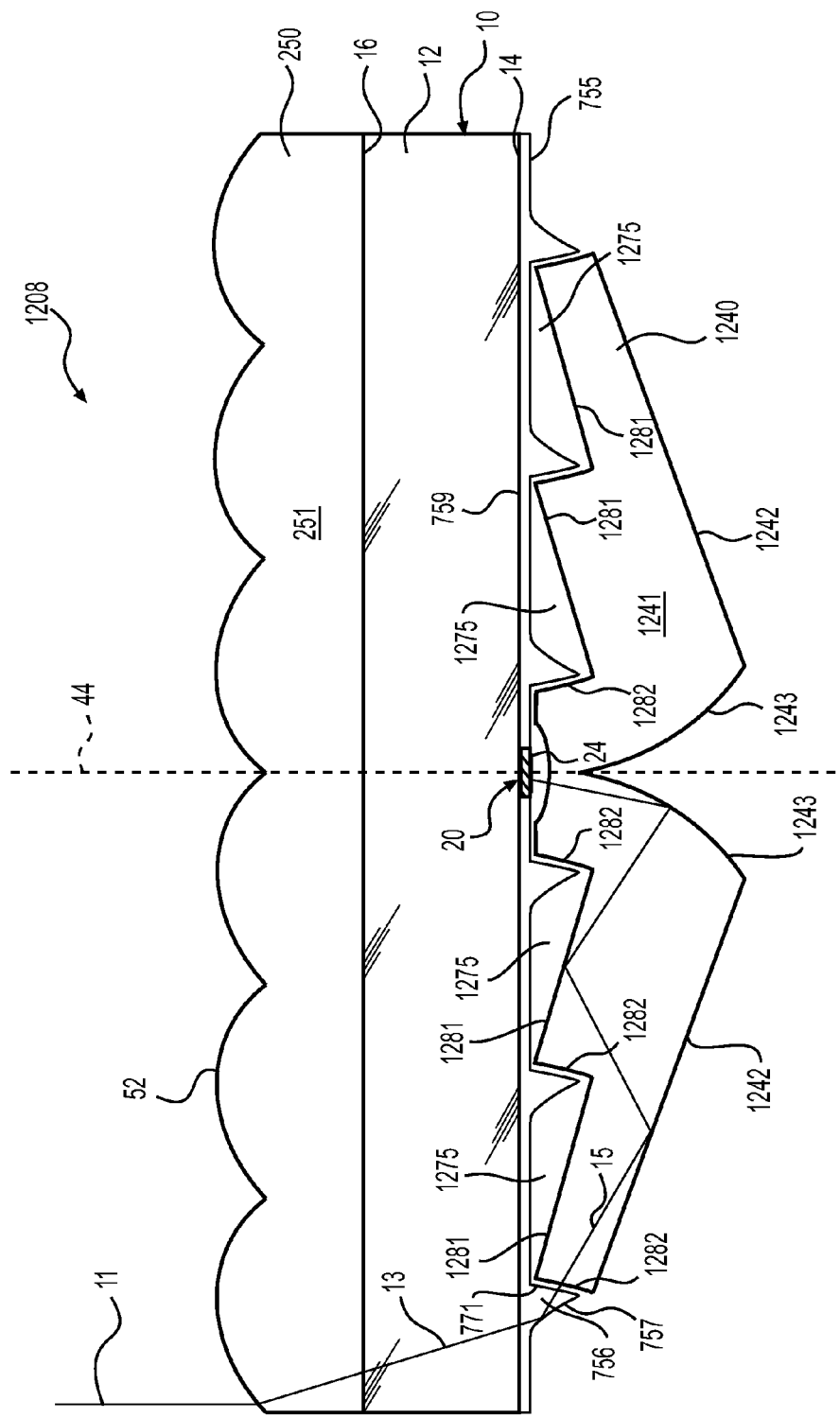
FIG. 20 is a cross-sectional view of another embodiment of an optical unit that has a secondary redirecting optic between the substrate assembly and the redirecting optic.

FIG. 20 shows a cross section of an optical unit 1208 generally similar to the embodiment of FIG. 15 in that it includes a dispersing optic 250, a substrate assembly 10, a secondary redirecting optic 755, and a primary light redirecting optic 1240.

The primary light redirecting optic 1240 includes a planar reflective surface 1242, a plurality of step reflector surfaces 1281 opposite to the planar reflective surface 1242 and a conditioning surface 1243. The step reflector surfaces 1281 are separated by output surfaces 1282 which are generally perpendicular to the step reflector surfaces 1281. There is an area 1275 between the secondary redirecting optic 755 and the primary light redirecting optic 1240 that can be filled with air or any suitable light transmissive material such as an optical adhesive.

In this embodiment light from the light source 24 is reflected within the primary light redirecting optic 1240 by the conditioning surface 1243. The reflected light is then transmitted within the light transmissive body 1241 of the primary light redirecting optic 1240 by total internal reflections on the planar reflective surface 1242 and on the plurality of step reflector surfaces 1281 until it reaches an output surface 1282. The light 15 exits the light redirecting optic 1240 through the output surface 1282 and enters the secondary redirecting optic 755 through an input surface 771 of a secondary redirecting element 756 of the secondary redirecting optic 775. Light is reflected by a secondary reflective surface 757 of the secondary redirecting element 756. Secondary reflective surface 757 is positioned behind a focus of a lens 52 such that light 13 is reflected by the secondary reflective surface 757 through the secondary redirecting optic 755, through the rigid sheet 12 and through the light transmissive body 251 of the light dispersing element 250. Light 13 is refracted by the lenses 52 and exits as a substantially collimated beam of light 11.

Figure 21:
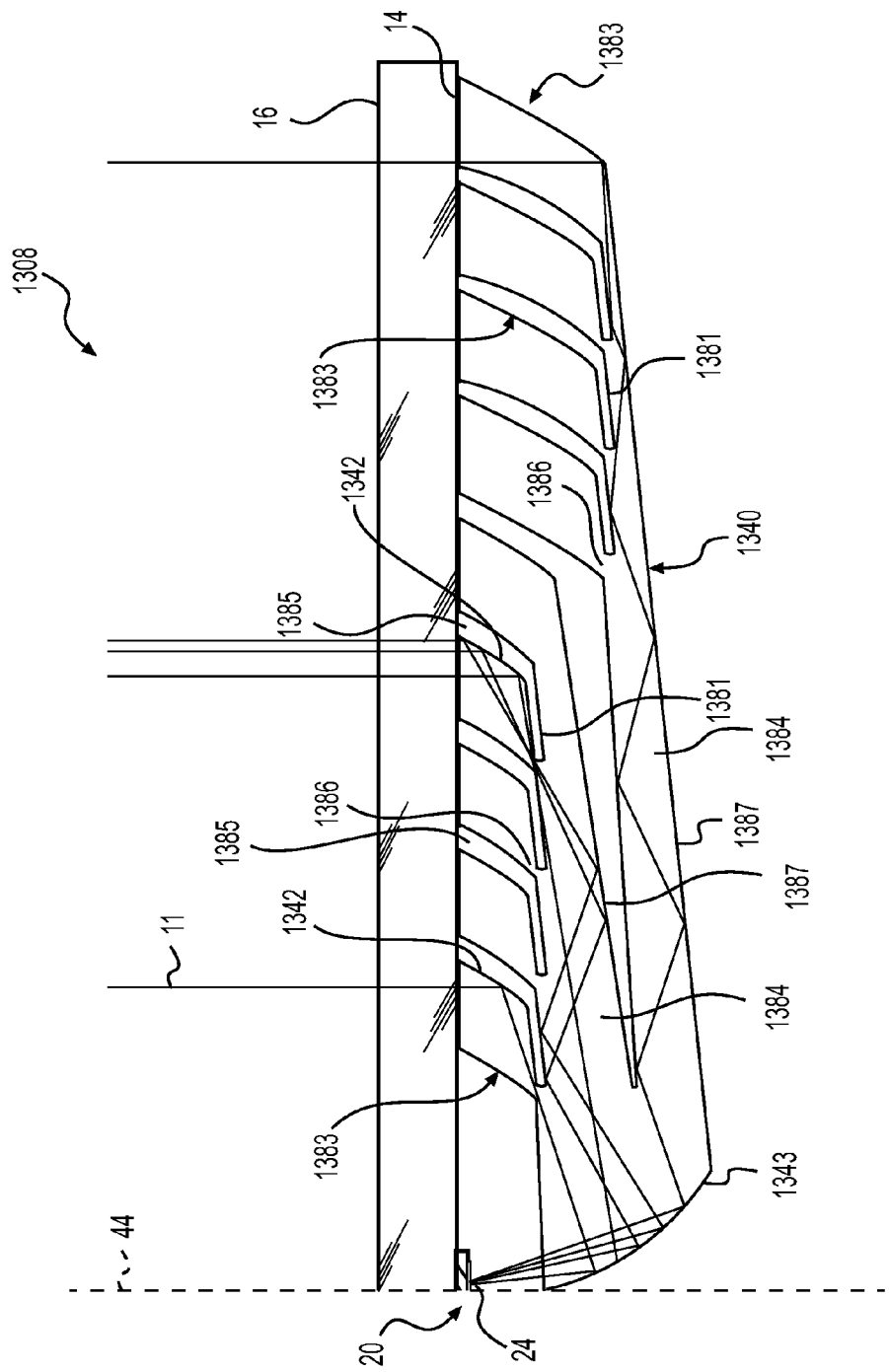
FIG. 21 is a cross-sectional view of an embodiment of an optical unit in which the redirecting optic has dispersing portions and redirecting portions.

FIG. 21 is a cross section of an optical unit 1308 in which the light redirecting optic 1340 includes dispersing portions 1383 and redirecting portions 1384. The dispersing portions 1383 include a plurality of reflecting surfaces 1342 to reflect the light out as a substantially collimated beam. The light redirecting optic 1340 has a plurality of reflector elements 1385 that can be filled with air or a light transmissive material having a lower index of refraction than the light redirecting optic 1340, to allow TIR on the reflective surfaces 1342 and on a plurality of step reflector surfaces 1381.

In this embodiment, light 11 from the light source 24 is reflected by a conditioning surface 1343 into the redirecting portions 1384 of the light transmissive body of the optical unit 1308. The redirecting portions 1384 redirect the light via total internal reflections on step reflector surfaces 1381 and on planar reflectors 1387 positioned opposite to the step reflector surfaces 1381 to an input area 1386 of a dispersion portion 1383. Light in a dispersing portion 1383 will be transmitted to one of a plurality of reflecting surfaces 1342, off of which it will reflect through the rigid sheet 12 and exit as a substantially collimated beam 11 of light. Although, FIG. 21 shows a light redirecting optic 1340 with two redirecting portions 1384 and two dispersing portions 1383, it is possible to manufacture an optical unit with any number of redirecting portions and corresponding dispersing portions.

Figure 22:
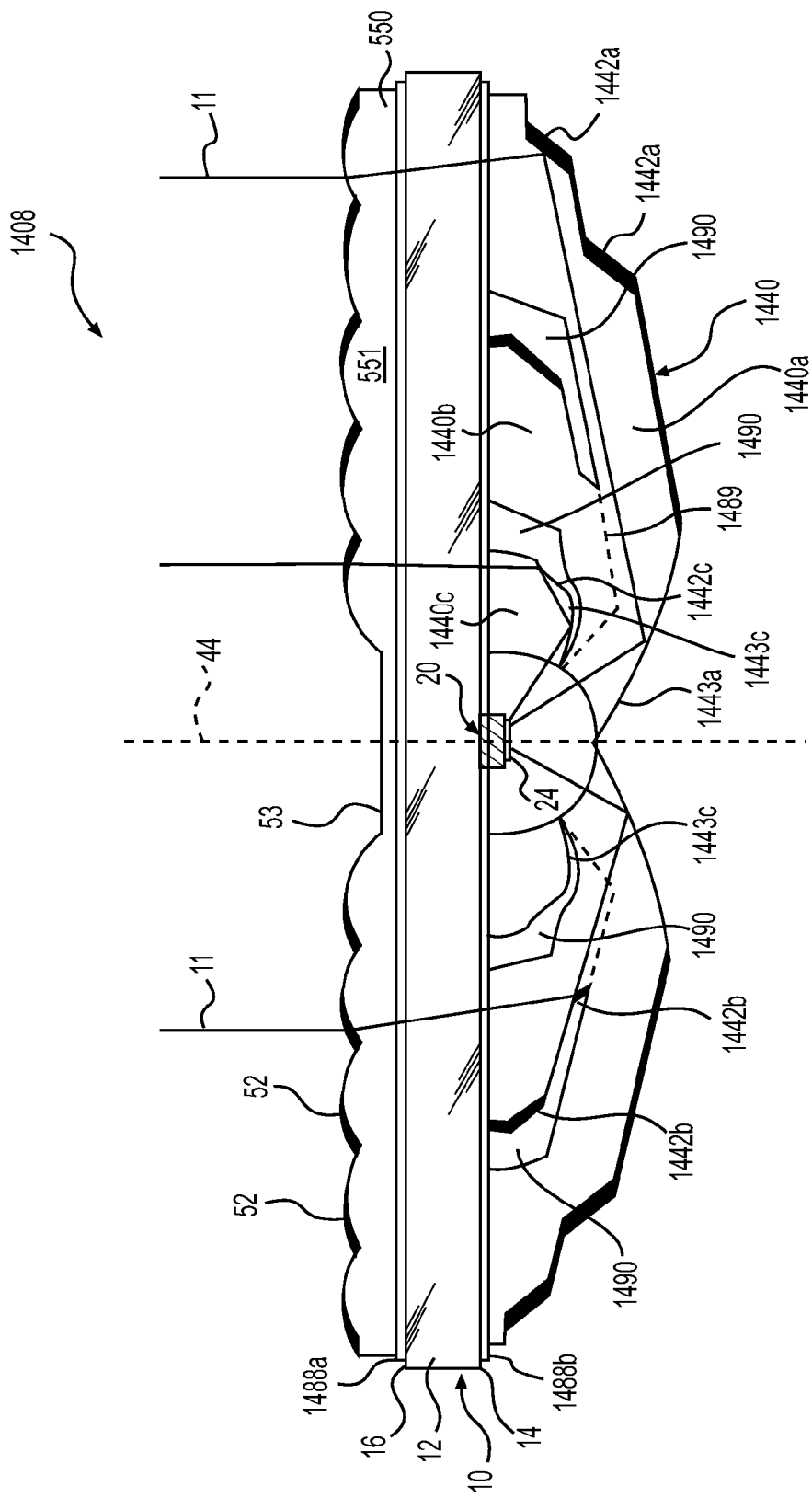
FIG. 22 is a cross-sectional view of an embodiment of an optical unit in which the redirecting optic has three redirecting stages.

Turning to FIG. 22 there is provided an optical unit 1408 having a light redirecting optic 1440 composed of three light redirecting stages 1440a, 1440b, 1440c. The first light redirecting stage 1440a includes reflecting surfaces 1442a and a first conditioning surface 1443a; the second light redirecting stage 1440b includes reflecting surfaces 1442b; and the third light redirecting stage 1440c includes a reflecting surface 1442c and a second conditioning surface 1443c. The three light redirecting stages 1440a, 1440b, 1440c can be manufactured separately, for example, by injection molding, 3D printing or embossing, and subsequently assembled together. The first and second light redirecting stages 1440a and 1440b are optically bonded, for example, by means of an optical bonding agent at the bonding interface surface 1489 denoted by the dotted line. Further, all three light redirecting stages 1440a, 1440b, 1440c can be bonded to the first surface 14 of the rigid sheet 12 by means of an optical bonding agent 1488b, for example a polymer such as silicone rubber or gel. As shown in FIG. 22, when the light redirecting optic 1440 is assembled, gaps 1490 remain between the light redirecting stages 1440a, 1440b, 1440c.

These gaps 1490 allow for TIR on the reflecting surfaces 1442a, 1442b, 1442c and on the conditioning surfaces 1443a, 1443c.

A dispersing optic 550 is optically and mechanically bonded to the second surface 16 of a rigid sheet 12 also by means of an optical bonding agent 1488a, for example a polymer such as silicone rubber or gel. In this embodiment light from the light source 20 may be reflected by the second conditioning surface 1443c and then the reflecting surface 1442c of the third light redirecting stage 1440c. Light from the light source 24 may also be reflected by the first conditioning surface 1443a and then one of the reflecting surfaces 1442a or 1442b of the first or second light redirecting stages 1440a, 1440b (as the case may be). Light travels from the first light redirecting stage 1440a to the second light redirecting stage 1440b through the bonding interface 1489. Light from the reflecting surfaces the 1442a, 1442b and 1442c is transmitted through the rigid sheet 12 and the light transmissive body 551 of the light dispersing optic 550 to the lenses 52, from which the light 11 exits as a substantially collimated beam.

Figure 23:
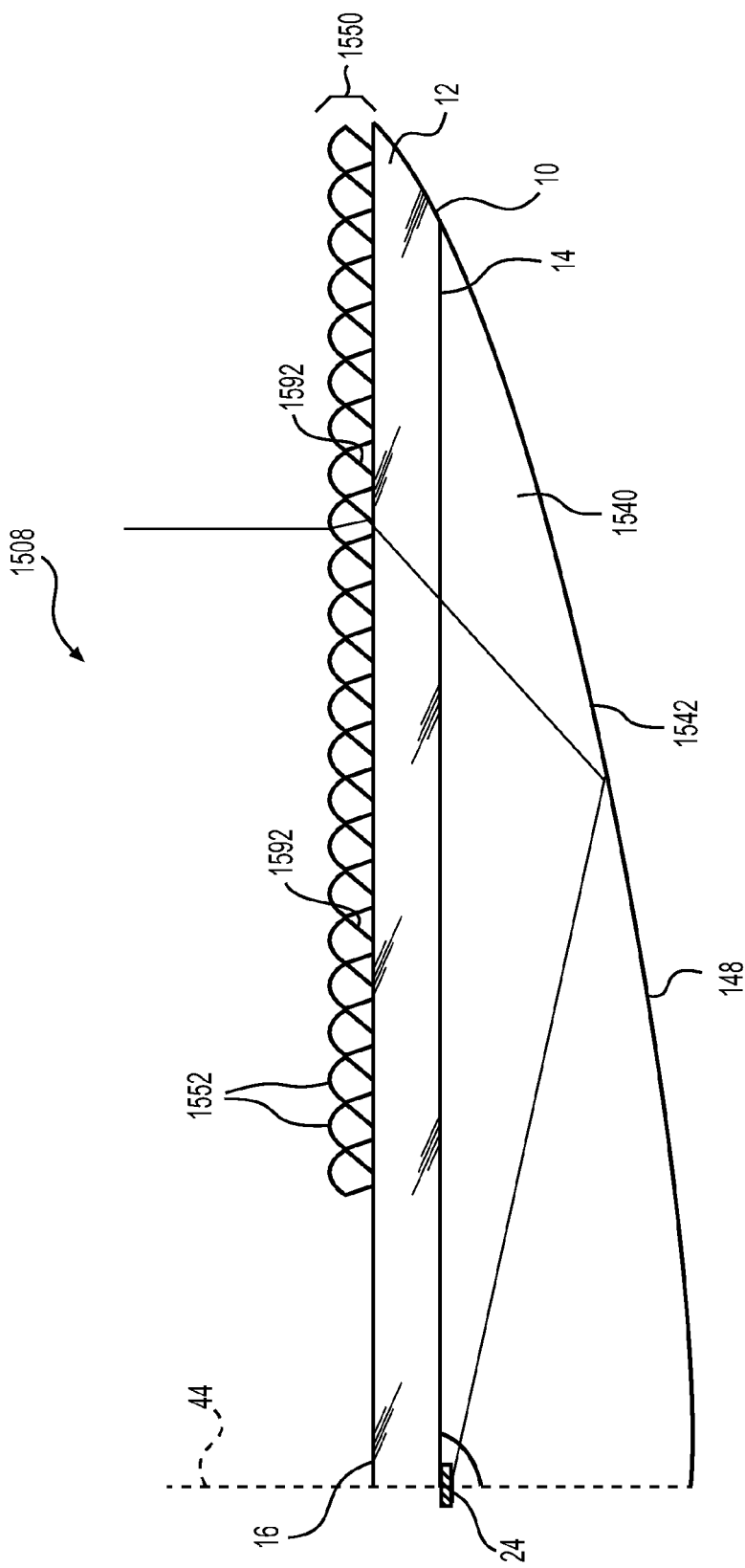
FIG. 23 is a cross-sectional view of an embodiment of an optical unit in which the dispersing optic has lenses and redirecting surfaces.

FIG. 23 shows a cross section of an optical unit 1508 in which the dispersing optic 1550 includes a plurality of lenses 1552 and a plurality of redirecting surfaces 1592. In this embodiment the light redirecting optic 1540 has reflecting surface 1542 coated with a mirror coating 148. Light from the light source of the light source assembly 24 is transmitted to the reflecting surface 1542 off which it reflects and is transmitted through the rigid sheet 12 to a redirecting surface 1592 of the dispersing optic 1550. The reflecting surface 1592 reflects to the light towards one of the lenses 1552, from which the light exits as a substantially collimated beam.

Figure 24A:
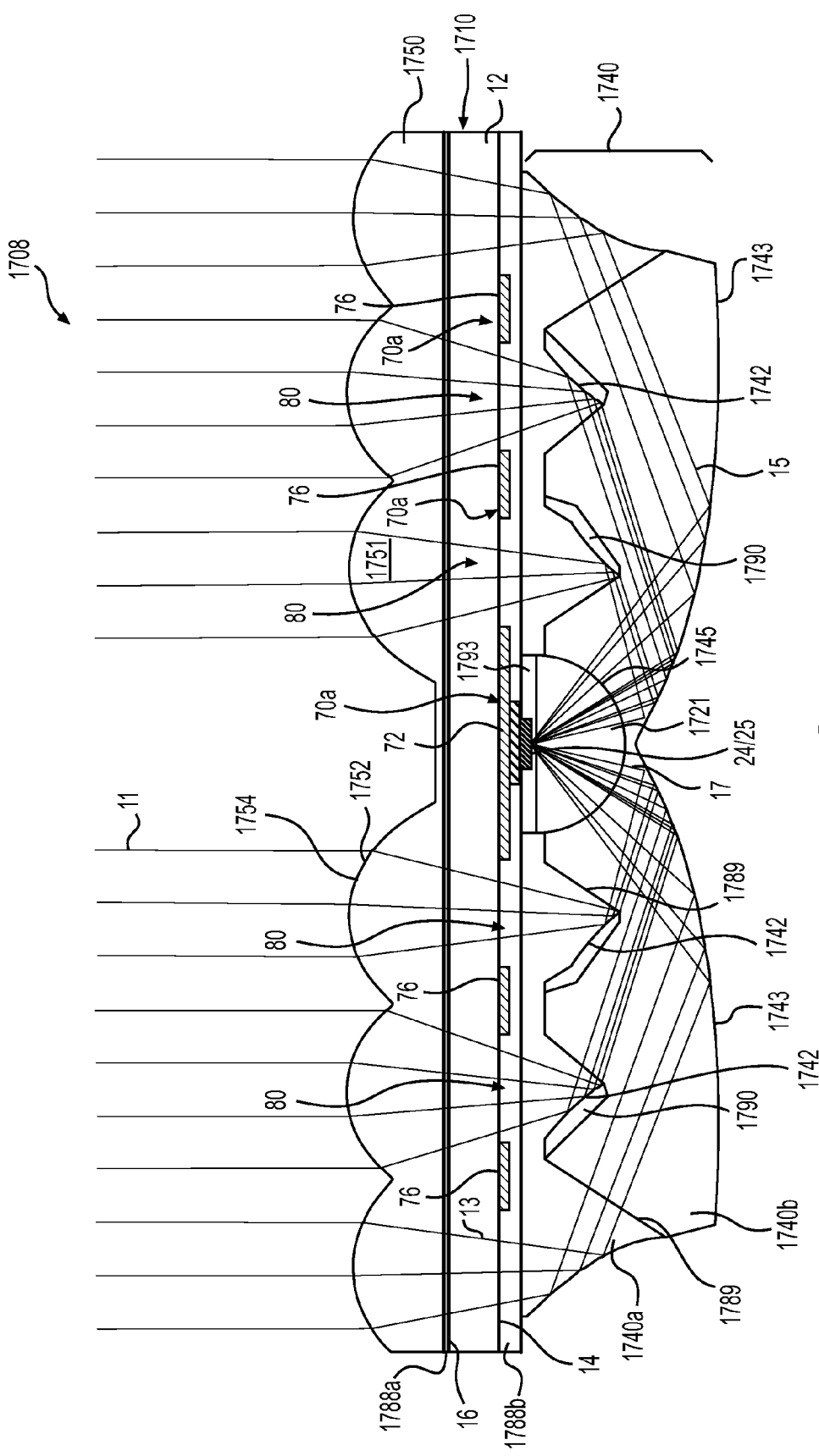

As described in FIGS. 7A and 7B, conductor patterns employing heat spreader portions 70 may be electrically and thermally connected to the interconnection traces 32 of an optical unit 8 in order to cool larger optical units 8. FIG. 24A shows a cross section of an optical unit 1708 employing conductor patterns such as those described in FIGS. 7A and 7B. This figure illustrates how the path of the light is not interrupted by the positive arms 76 or negative arms 78 of the heat spreader portion 70a, and instead, the light is transmitted through the gaps 80, into the light dispersing optic 1750.

The optical unit 1708 shown in FIG. 24A includes a dispersing optic 1750, two layers of an optical bonding agent 1788a, 1788b, a substrate assembly 1710, and a light redirecting optic 1740. The dispersing optic 1750 is optically and mechanically bonded to the second surface 16 of the rigid sheet 12 by means of an optical bonding agent 1788a. The light redirecting optic 1740 includes a redirecting portion 1740a and a guiding portion 1740b which can be manufactured separately, for example by injection molding or embossing, and then assembled together by means of an optical adhesive or any suitable optical bonding means. When assembled together, gaps 1790 remain between the redirecting portion 1740a and the guiding portion 1740, to enable TIR at a plurality of reflective surfaces 1742 of the redirecting portion 1740a.

As will be appreciated by those skilled in the art, optics of any of the optical units described above can be employed as a solar concentrator by reversing the direction of light travelling therethrough and replacing light source 24 with a photovoltaic cell 25, such as a triple junction photovoltaic cell. In order to illustrate this duality of the optical units, the direction of light rays 11 of FIGS. 24A-26 are omitted in order to show that the light could be entering the optical unit through the lenses 1752, or it could be emerging therefrom. The heat produced by the photovoltaic cell 25 or light source 24 is transmitted away from the central axis 44 towards the edges by means of the positive arms 76 and the negative arms 78. The direction of heat transfer is shown in FIG. 24B by arrows 1794.

In this embodiment, the light source assembly 20 is coated with an optical and dielectric encapsulant 1793, which in some embodiments may be the same material as the optical bonding agent 1788b. The envelope 1721 thermally insulates the photovoltaic cell 25 or the light source 24 from the light redirecting optic 1740. The envelope 1221 can be a separate molded component. However, in one alternative embodiment, the optical bonding agents 1788b, the encapsulant 1793 and the envelope 1721 can all be made of the same material, for example silicone, and therefore they would be a single component.

It is possible to assemble the light redirecting optic 1740 with the envelope 1721 into a single solid piece by attaching the envelope 1721 to a cavity 1745 in the light redirecting optic 1740. The redirecting portion 1740a, the guiding portion 1740b and the envelope can be manufactured separately, for example by injection molding, and subsequently bonded together by means of a suitable bonding agent before being assembled onto the first surface 14 of the receiver substrate assembly 1710 by means of the optical bonding agent 1788b. FIG. 24C shows how the redirecting portion 1740a, the guiding portion 1740b and the envelope 1721 fit together.

An optical unit 1708 such as the one shown in FIGS. 24A-24C can behave as a solar concentrator by focusing light 11 impinging on the surface 1754 of the lenses 1752. The focussed light 13 is transmitted through the light transmissive body 1751 of the dispersing optic 1740, the optical bonding agents 1788a, 1788b, the rigid sheet 12 and through the gaps 80 of the heat spreader portion 70a of the conductor pattern 30 into the redirecting portion 1740a of the redirecting optic 1740. The focussed light 13 is intercepted by a reflective surface 1742, which reflects the light through the bonding interface 1789 into the guiding portion 1740b where the light is reflected towards the photovoltaic cell 25 by a conditioning surface 1743.

The same optical unit 1708 of FIGS. 24A-24C can be used as an illumination device in the following manner. Light 17 diverging away from the light source 24 is transmitted through the encapsulant 1793 and the envelope 1721 into the guiding portion 1740b of the redirecting optic 1740. The conditioning surface 1743 then reflects the light through the bonding interfaces 1789 into the redirecting portion 1740a of the redirecting optic 1740 where the reflective surfaces 1742 reflect the light such that it diverges away from the reflective surfaces 1742 towards the lenses 1752. The light 13 diverges away from the reflective surfaces 1742 to the lenses 52 through gaps 80 in the heat spreader 70a of the portion of the conductor pattern, thereby avoiding the positive and negative arms 76, 78 and the positive and negative termini 72, 74. The lenses 1752 collimate the output light 11.

Figure 25:
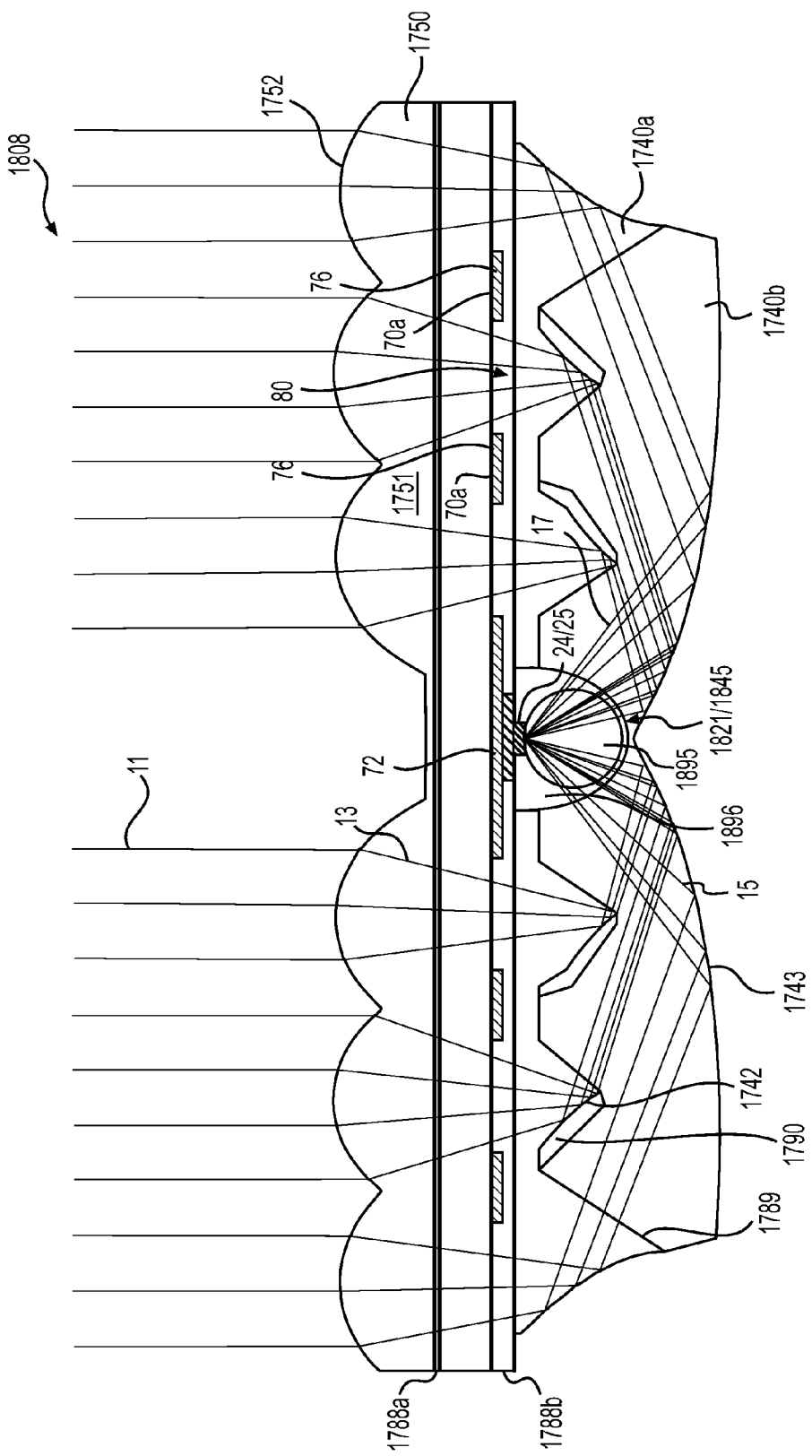
FIG. 25 is a cross-sectional view of another embodiment of an optical unit transmitting light through the gaps in a heat spreader portion, and where the redirecting optic has a redirecting portion and a guiding portion.
Figure 26:
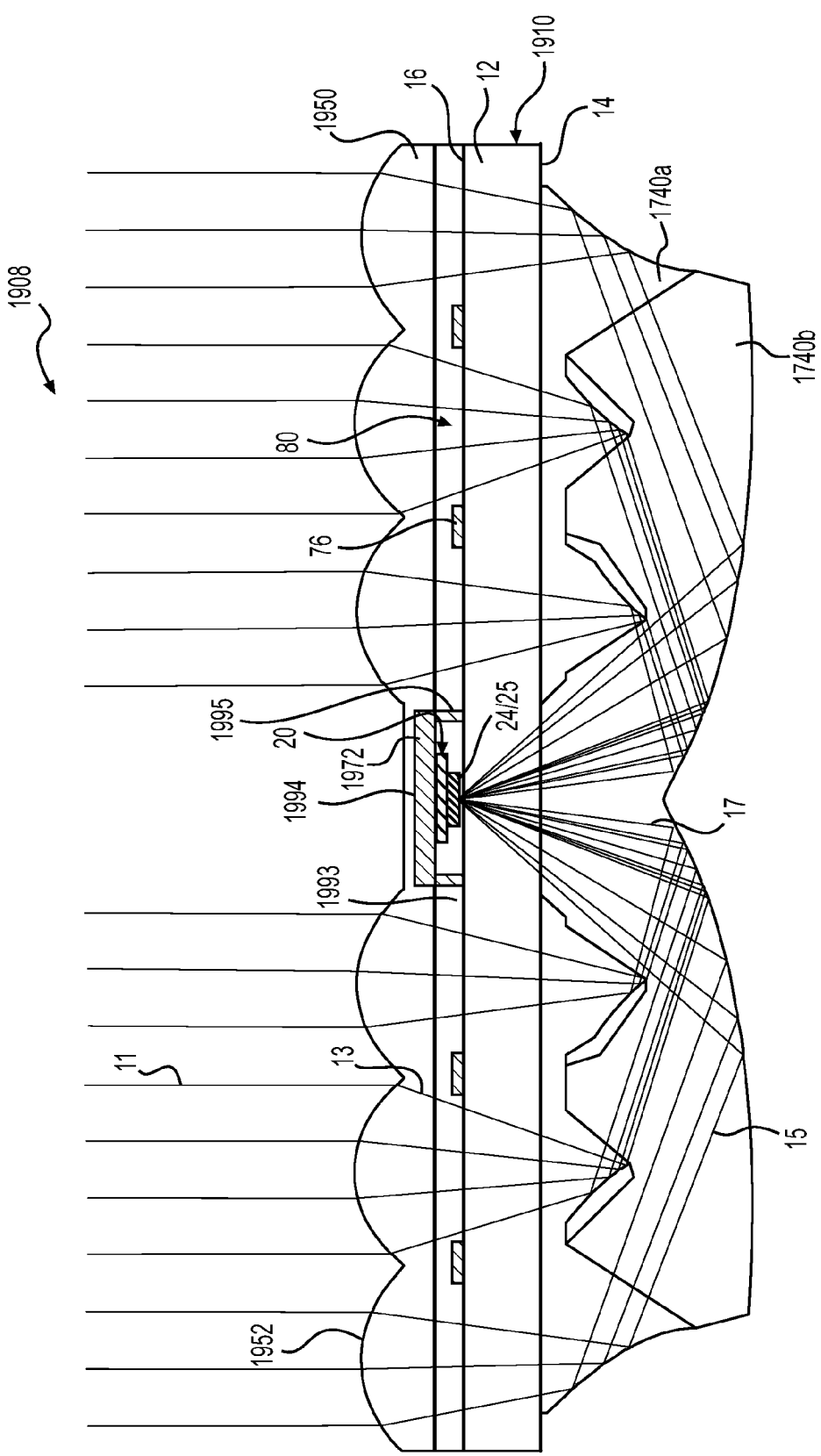
FIG. 26 is a cross-sectional view of another embodiment of an optical unit transmitting light through the gaps in a heat spreader portion, and where the redirecting optic has a redirecting portion and a guiding portion.

FIG. 25 show a cross section of an optical unit 1808 generally similar to the embodiment shown in FIGS. 24A-24C and any elements not described in relation to this embodiment below can be found in the description of the embodiment above. The embodiment of FIG. 25 differs from that of FIGS. 24A-24C only in that the envelope 1821 includes a spherical optic 1895 and an encapsulating material 1896. The spherical optic 1895 can be a bead made of a light transmissive material capable of withstanding a high flux of light, such as glass or silicone. The encapsulating material can be air or any suitable light transmissive material. In some embodiments the encapsulating material may be the same material as the bonding agent 1788*b*.

It is also possible to use the rigid sheet 12 for the same purpose as an envelope 21, where the rigid sheet is made of a thermally insulating material such as glass. This can be achieved by positioning the photovoltaic cell 25 or the light source 24 against the second surface 16 with an encapsulant 1993 between the glass and the receiver assembly 20. This encapsulant 1993 may extend to the edges of the optical unit 1908 encapsulating the positive and negative arms 96, 98 and forming an optical bond between the dispersing optic 1750 and the substrate assembly 1910. In this embodiment, the positive terminus 1972 is raised away from the positive and negative arms 76, 78, and therefore, the dispersing optic 1950 has a groove 1994 to house the positive terminus 1972. The positive terminus 1972 has extensions 1995 that extend to the glass in order to transfer heat thereto.

It will be appreciated by those skilled in the art that the photovoltaic cells 25 described above can be replaced by any suitable solar energy collector.

Figure 27:
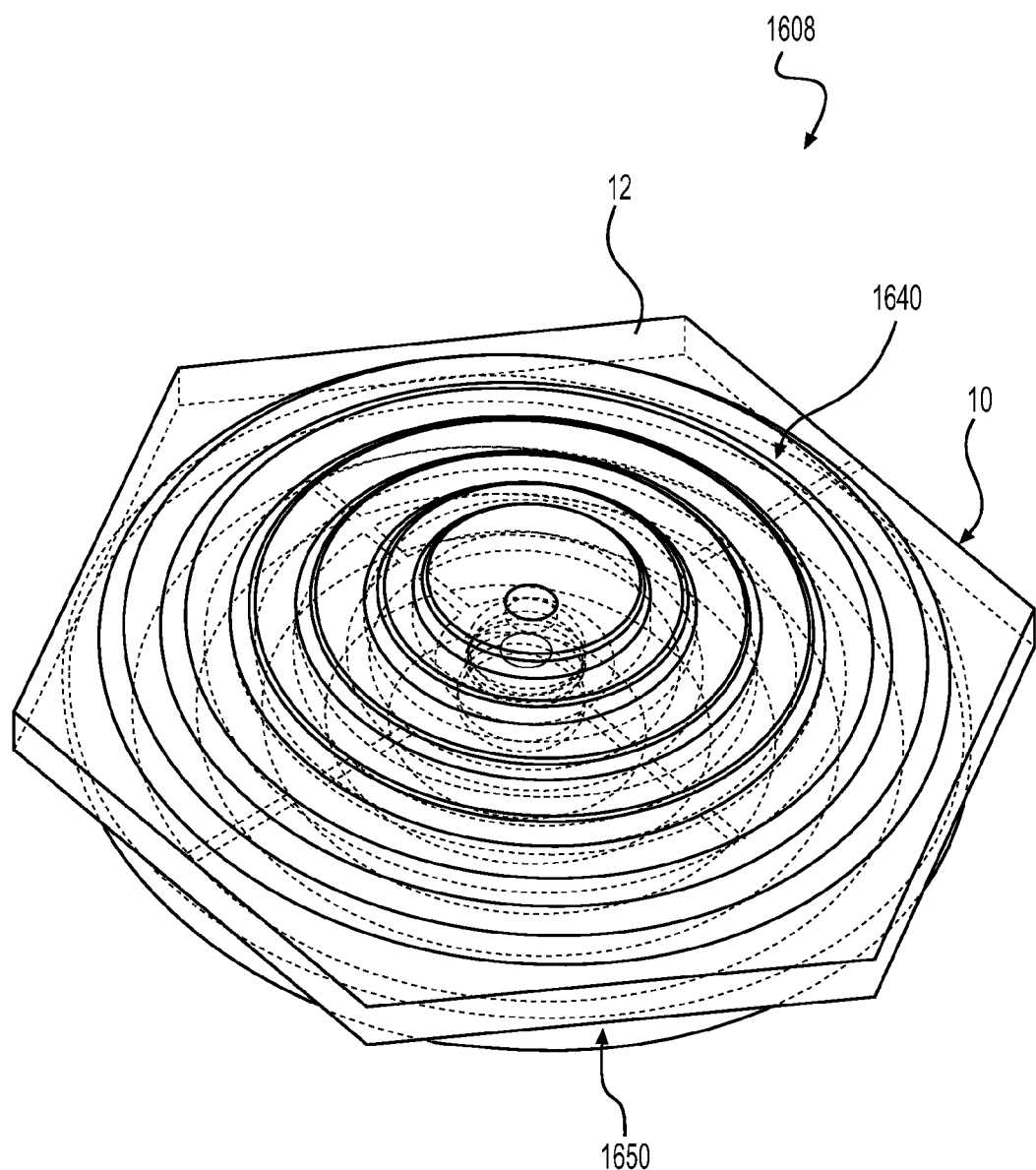
FIG. 27 is a perspective view of another embodiment of an optical unit.

FIG. 27 is an isometric view of an assembled optical unit 1608 including a light redirecting optic 1640, a substrate assembly 10 and a dispersing optic 1650. The rigid sheet 12 is cropped into a hexagonal shape for the purpose of illustrating a single assembled optical unit, however a panel 2, as shown in FIG. 2, may include several optical units on a single rectangular substrate assembly. Although this embodiment shows a circular light redirecting optic 1640 and a circular dispersing optic 1650, these can be cropped into a tillable shape such as a square or a hexagon to eliminate dead space.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

The invention claimed is:

1. A device for providing illumination comprising:
    a panel having at least one rigid layer, the at least one rigid layer having at least one patterned electrical circuit thereon;
    an array of illuminating units, each unit being formed by at least one rigid element and a portion of the at least one rigid layer, each unit including:
        a rigid optical redirecting element secured to the at least one rigid layer for redirecting light out of the unit,
        a light source secured to the at least one rigid layer and sandwiched within the panel for converting electrical energy into light, and
        an electrical conductor in electrical communication with the light source to transmit electrical energy thereto, the electrical conductor being in thermal communication with the light source to receive thermal energy therefrom, the electrical conductor being a heat sink for the light source, the light source being cooled via conduction, a pattern of the electrical conductor defining a plurality of gaps;
    the electrical conductor and the optical redirecting element of each unit being dimensioned and arranged within the unit such that the electrical conductor does not materially impede transmission of light generated by the light source from within the unit to out of the unit, light generated by the light source being redirected by the optical redirecting element toward at least one of the plurality of gaps, the redirected light diverging from the optical redirecting element, the diverging light subsequently passing through at least one of the plurality of gaps;
    the electrical conductor being at least electrically and thermally interconnected with the patterned circuit to transmit electrical energy to the light source and to receive thermal energy from the light source for transmission away from the unit.

2. The device of claim 1, wherein the light source of each unit is sandwiched between the at least one rigid layer and the rigid optical redirecting element of that unit.

3. The device of claim 1, wherein the optical redirecting element of each unit is a series of concentric annular optical redirecting elements.

4. The device of claim 1, wherein the rigid optical redirecting elements of multiple units are all part of a single rigid layer distinct from the at least one rigid layer having the at least one patterned electrical circuit thereon.

5. The device of claim 1, wherein the electrical conductor and the optical redirecting element of each unit are dimensioned and arranged within the unit such that the electrical conductor impedes transmission of no more than 20% of the light generated by the light source within the unit to out of the unit.

6. The device of claim 1, wherein
    each unit of the array further includes a rigid optical dispersing element secured to the at least one rigid layer for receiving light redirected within the unit by the optical redirecting element; and
    the electrical conductor, the optical redirecting element, and the optical dispersing element of each unit are dimensioned and arranged within the unit such that the electrical conductor does not materially impede transmission of light generated by the light source within the unit to outside the unit.

7. The device of claim 6, wherein the light source of each unit is sandwiched between the at least one rigid layer and the rigid optical dispersing element of that unit.

8. The device of claim 6, wherein the optical dispersing element of each unit is a series of optical dispersing elements.

9. The device of claim 6, wherein:
    the optical redirecting element of each unit is a series of optical redirecting elements; and
    the optical dispersing element of each unit is a series of optical dispersing elements.

10. The device of claim 6, wherein:
    the optical redirecting element of each unit is a series of concentric annular optical redirecting elements; and
    the optical dispersing element of each unit is a series of concentric annular optical dispersing elements.

11. The device of claim 6, wherein the rigid optical redirecting element of each unit redirects light from a light guide for transmission to the rigid optical dispersing element of that unit.

12. The device of claim 11, wherein the light guide has a secondary optical element for redirecting light within the light guide.

13. The device of claim 6, wherein:
    the optical redirecting element is an optical reflecting element; and
    the optical dispersing element is an optical refracting element.

14. The device of claim 6, wherein the electrical conductor, the optical redirecting element, and the optical dispersing element of each unit are dimensioned and arranged within the unit such that the electrical conductor impedes transmission of not more than 20% of light generated by the light source within the unit to out of the unit.

15. The device of claim 1, wherein the light source is at least partially encased in a thermal insulator.

16. The device of claim 1, wherein:
the electrical conductor comprises at least one arm;
at least one of the plurality of gaps defined by the pattern of the electrical conductor is located on each side of the at least one arm; and
substantially no light being redirected by the plurality of redirecting elements is received by the at least one arm.

17. The device of claim 1, wherein the pattern of the electrical conductor includes:
at least one heat spreader portion for conducting heat away from the light source, the at least one heat spreader including:
at least one electrical trace in electrical communication with the light source to transmit electrical energy thereto, and
a plurality of arms extending from the at least one electrical trace, at least one of the plurality of gaps being defined by at least two of the plurality of arms; and
wherein a portion of light being redirected by the series of optical redirecting elements passes through the at least one of the plurality of gaps.

18. A device for providing illumination comprising:
a panel having a plurality of rigid layers bonded together;
an array of illuminating units formed by the plurality of layers of the panel, each one of the array of illuminating units including:
a series of optical dispersing elements associated with a first surface of one of the layers of the plurality of layers for dispersing light outside the unit;
a series of optical redirecting elements associated with a second surface of one of the layers of the plurality of layers for redirecting light within the unit to the optical dispersing elements;
a light source sandwiched between two of the layers of the plurality of layers for converting electrical energy into light;
one of the layers of the plurality of layers having an electrical conductor in electrical communication with the light source to transmit electrical energy thereto, the electrical conductor being in thermal communication with the light source to receive thermal energy therefrom, the electrical conductor being a heat sink for the light source, the light source being cooled via conduction, a pattern of the electrical conductor defining a plurality of gaps;
the electrical conductor, the series of optical dispersing elements and the series of optical redirecting elements being dimensioned and arranged within the unit such that the electrical conductor does not materially impede transmission of light generated by the light source within the unit to out of the unit, light generated by the light source being redirected by at least one of the series of optical redirecting elements toward at least one of the plurality of gaps, the redirected light diverging from the optical redirecting element, the diverging light subsequently passing through at least one of the plurality of gaps;
one of the layers of the plurality of layers having a patterned circuit electrically and thermally interconnected with light source of at least some of the units to transmit electrical energy thereto and to receive thermal energy therefrom for transmission away from the units.

19. The device of claim 18, wherein:
the series of optical dispersing elements are formed on the first surface; and
the series of optical redirecting elements are formed on the second surface.

20. The device of claim 18, wherein the electrical conductor, the optical dispersing element, and the optical redirecting element of each unit are dimensioned and arranged within the unit such that the electrical conductor impedes transmission of not more than 20% of the light generated by the light source within the unit to out of the unit.

* * * * *